United States Patent
Pav et al.

(10) Patent No.: US 10,146,271 B1
(45) Date of Patent: Dec. 4, 2018

(54) EXPANSION PLANAR COUPLING SYSTEM

(71) Applicant: Dell Products L.P., Round Rock, TX (US)

(72) Inventors: Darren Burke Pav, Round Rock, TX (US); Wesley Brook Morgan, Olympia, WA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/800,881

(22) Filed: Nov. 1, 2017

(51) Int. Cl.
| | |
|---|---|
| G06F 1/18 | (2006.01) |
| H01R 12/71 | (2011.01) |
| H01R 12/70 | (2011.01) |
| G06F 1/20 | (2006.01) |
| H05K 7/20 | (2006.01) |

(52) U.S. Cl.
CPC .............. G06F 1/185 (2013.01); G06F 1/184 (2013.01); G06F 1/20 (2013.01); H01R 12/7076 (2013.01); H01R 12/716 (2013.01); H05K 7/20136 (2013.01); H01R 2201/06 (2013.01)

(58) Field of Classification Search
CPC combination set(s) only.
See application file for complete search history.

(56) References Cited

U.S. PATENT DOCUMENTS

| | | | |
|---|---|---|---|
| 3,147,402 A | 9/1964 | Hochstetler | |
| 4,307,438 A | 12/1981 | Grubb | |
| 4,479,198 A * | 10/1984 | Romano | G06F 1/18 361/679.33 |
| 5,495,389 A * | 2/1996 | Dewitt | G06F 1/18 220/255 |
| 5,973,918 A * | 10/1999 | Felcman | G06F 1/184 361/679.6 |
| 6,000,767 A * | 12/1999 | Liu | G06F 1/181 312/223.2 |
| 6,392,875 B1 | 5/2002 | Erickson et al. | |
| 6,430,041 B1 * | 8/2002 | Johnson | G06F 1/181 165/126 |

(Continued)

OTHER PUBLICATIONS

"Secure the Drive Cage—Netra Server X5-2 Service Manual; Oracle Netra Server X5-2 Service Manual," 2015, 4 Pages, Oracle, https://docs.oracle.com/cd/E53596_01/html/E53601/z40000472041524.html.

*Primary Examiner* — Lisa Lea Edmonds
(74) *Attorney, Agent, or Firm* — Haynes and Boone, LLP

(57) ABSTRACT

An expansion planar system includes an expansion planar mounted to an expansion planar chassis and including expansion component(s) coupled to a system connector. A coupling subsystem mounted to the expansion planar chassis couples to a system chassis that includes a main planar and an expansion connector. While coupled to the system chassis, the coupling subsystem may provide the expansion planar chassis in a first orientation in which the system connector engages the expansion connector and the expansion planar chassis impedes access to component(s) on the main planar. While coupled to the system chassis, the coupling subsystem may also provide for rotation of the expansion planar chassis relative to the main planar to disengage the system connector from the expansion connector and provide the expansion planar chassis in a second orientation in which access to the component(s) on the main planar is no longer impeded by the expansion planar chassis.

20 Claims, 22 Drawing Sheets

(56) References Cited

U.S. PATENT DOCUMENTS

| | | | |
|---|---|---|---|
| 6,687,134 B2 * | 2/2004 | Vinson | G06F 1/184 |
| | | | 211/41.17 |
| 9,629,291 B1 * | 4/2017 | Chen | G06F 1/185 |
| 2013/0021742 A1 * | 1/2013 | Lee | G06F 1/185 |
| | | | 361/679.32 |

* cited by examiner

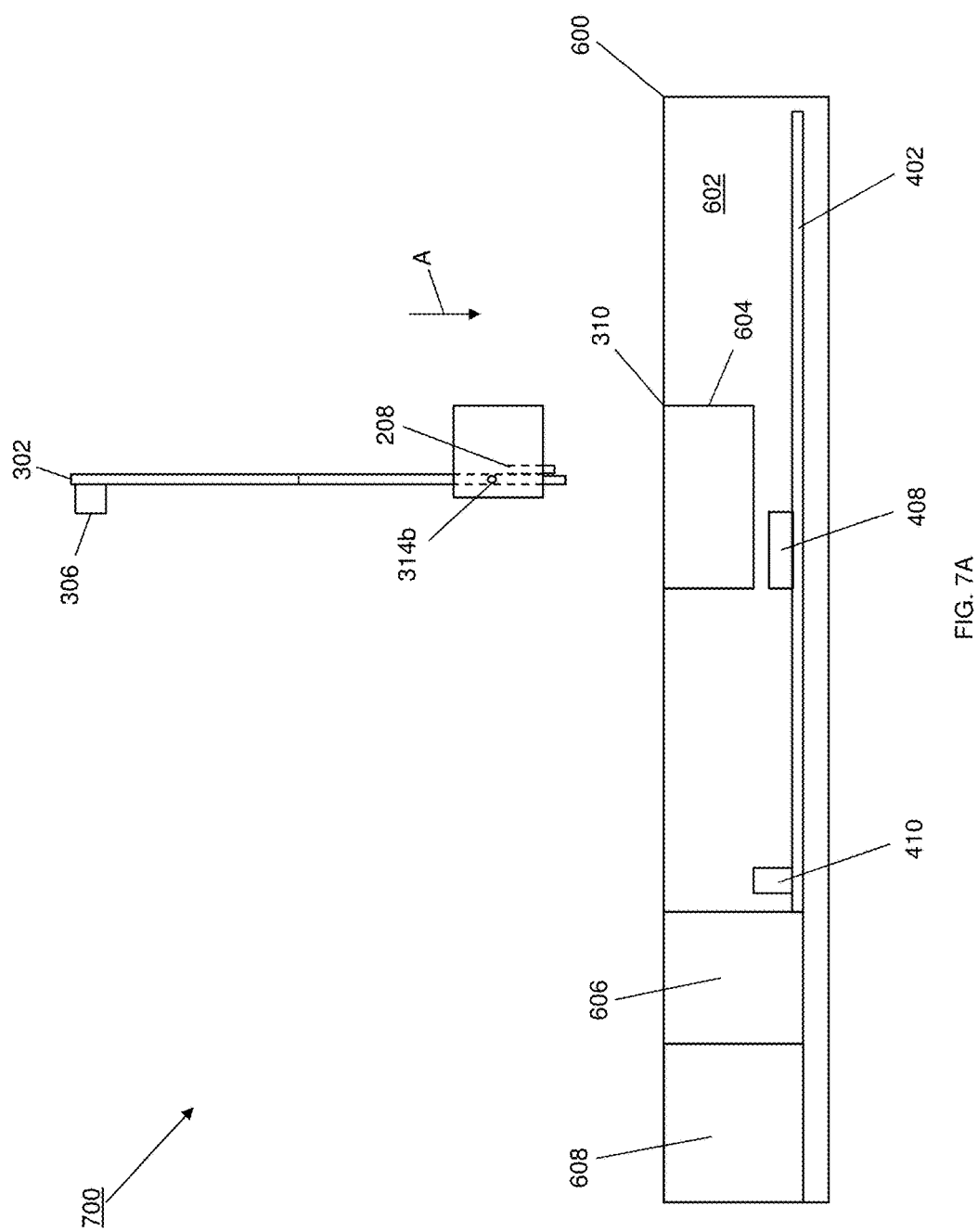

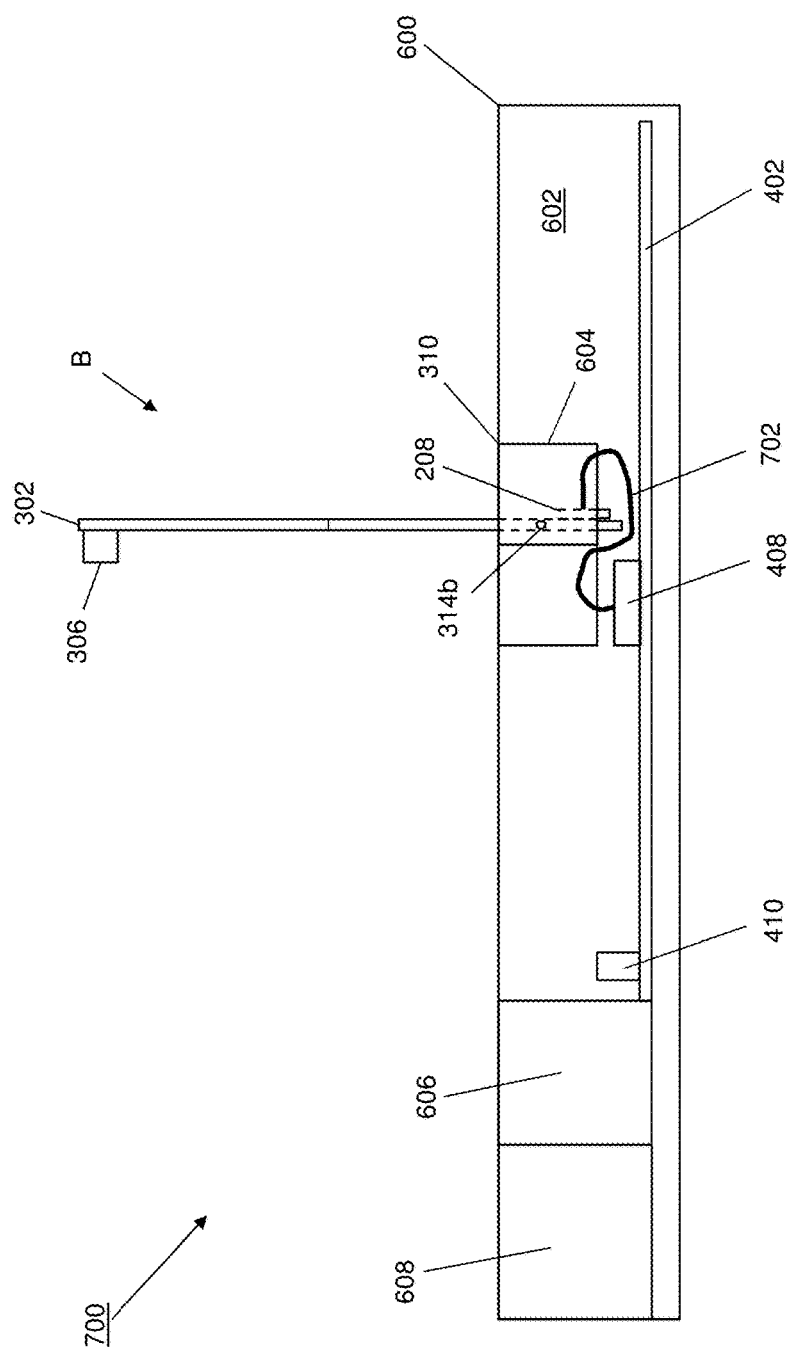

EXPANSION PLANAR COUPLING SYSTEM

BACKGROUND

The present disclosure relates generally to information handling systems, and more particularly coupling expansion planars in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, servers, may be provided in a variety of configurations. For example, servers may be provided in a "base" configuration where the server is provided with only a main planar (e.g., a motherboard) that includes two processors and a first plurality of memory devices (as well as other server components known in the art.) However, those servers may also be provided in an "expanded" configuration by coupling an expansion planar, which includes additional processors and memory devices, to the main planar. However, there are many challenges to providing expansion planars in server chassis, including how to couple the expansion planar to the main planar and the server chassis while maintaining a robust retention mechanism that can withstand shock and vibration events that may occur during shipping and/or use of the server. In conventional systems, these challenges have resulted in the expansion planar being statically mounted to both the chassis and the main planar, which impedes access to the main planar and requires disassembly of the expansion planar from the main planar when access to the components that are located on the main planar (or that are otherwise blocked by the expansion planar) is desired. As such, conventional expansion planar systems are often provided in a manner that can negatively affect the user experience with the server.

Accordingly, it would be desirable to provide an improved expansion planar coupling system.

SUMMARY

According to one embodiment, an Information Handling System (IHS) includes a system chassis; a main planar that is housed in the system chassis and that includes a processing subsystem and a memory subsystem; an expansion planar chassis that is coupled to the system chassis by a coupling subsystem; an expansion planar that is mounted to the expansion planar chassis; at least one expansion component that is located on the expansion planar; and a system connector that is located on the expansion planar and that is coupled to the at least one expansion component through the expansion planar; wherein the coupling subsystem is configured to: provide the expansion planar chassis in a first orientation in which the system connector engages the expansion connector and the expansion planar chassis impedes access to processing subsystem and the memory subsystem on the main planar; and provide for rotation of the expansion planar chassis relative to the main planar such that the system connector disengages the expansion connector and the expansion planar chassis enters a second orientation in which access to the processing subsystem and the memory subsystem on the main planar is no longer impeded by the expansion planar chassis.

BRIEF DESCRIPTION OF THE DRAWINGS

FIG. 7A is a side view illustrating an embodiment of the expansion planar system of FIGS. 2A-2D and 3A-3E being coupled to the main planar and the chassis of FIGS. 6A and 6B.

FIG. 7B is a side view illustrating an embodiment of the expansion planar system of FIGS. 2A-2D and 3A-3E coupled to the main planar system and the chassis of FIGS. 6A and 6B.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
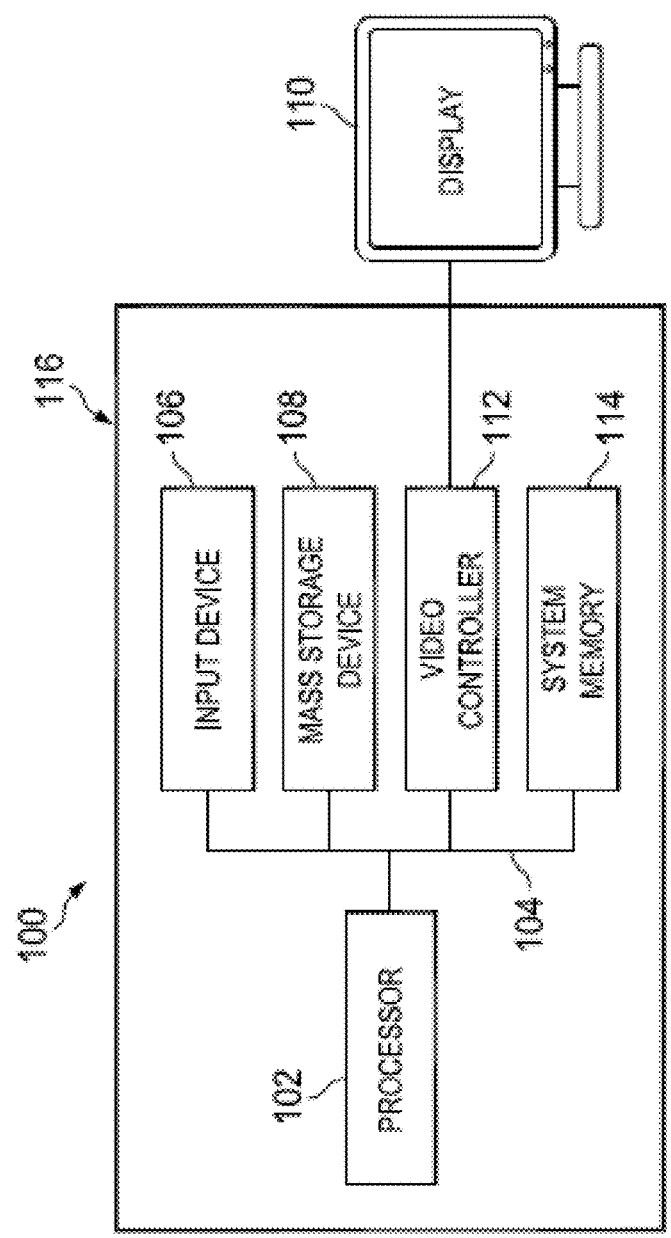
FIG. 1 is a schematic view illustrating an embodiment of an information handling system.
Figure 2A:
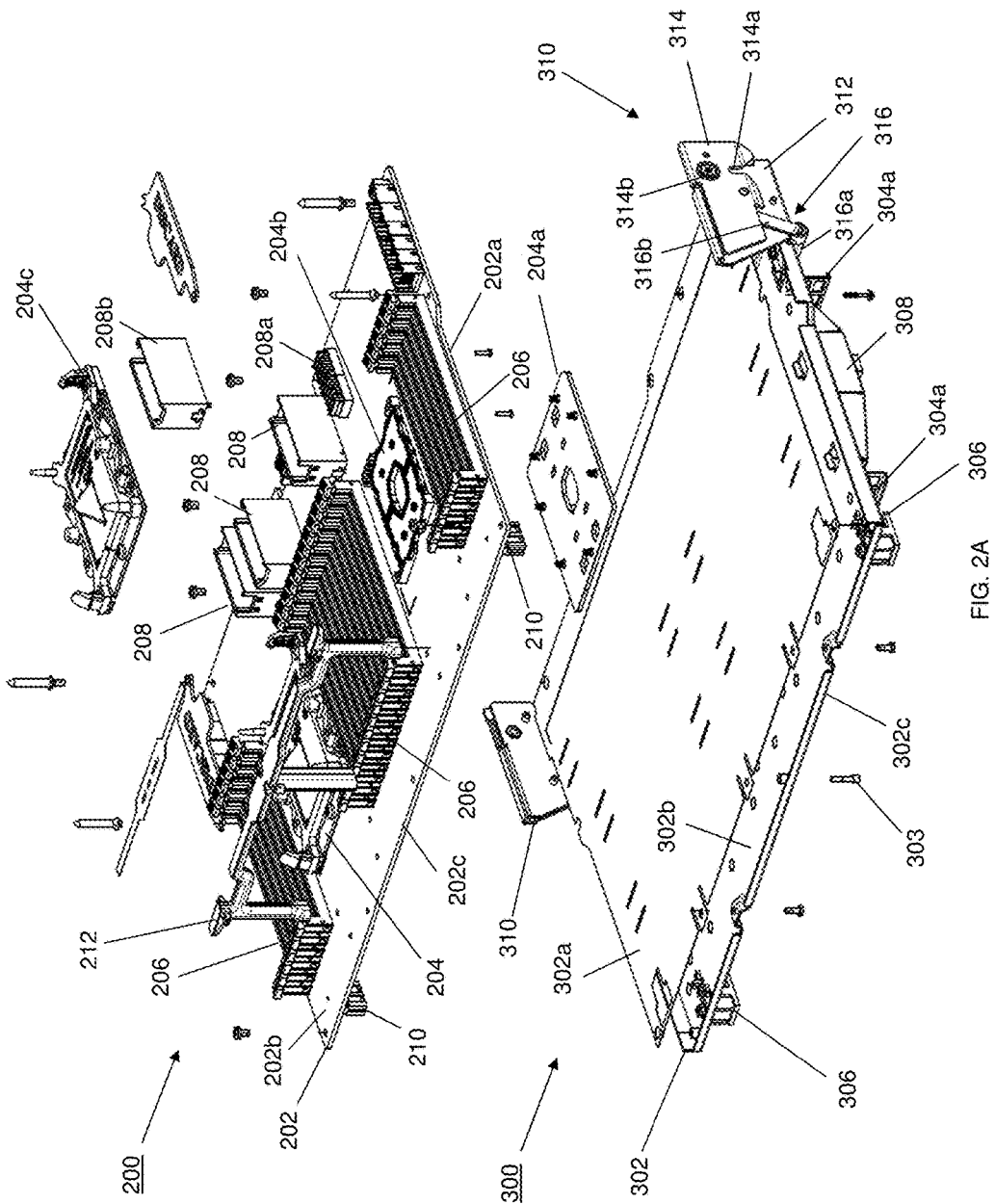
FIG. 2A is an exploded perspective view illustrating an embodiment of an expansion planar system.
Figure 2B:
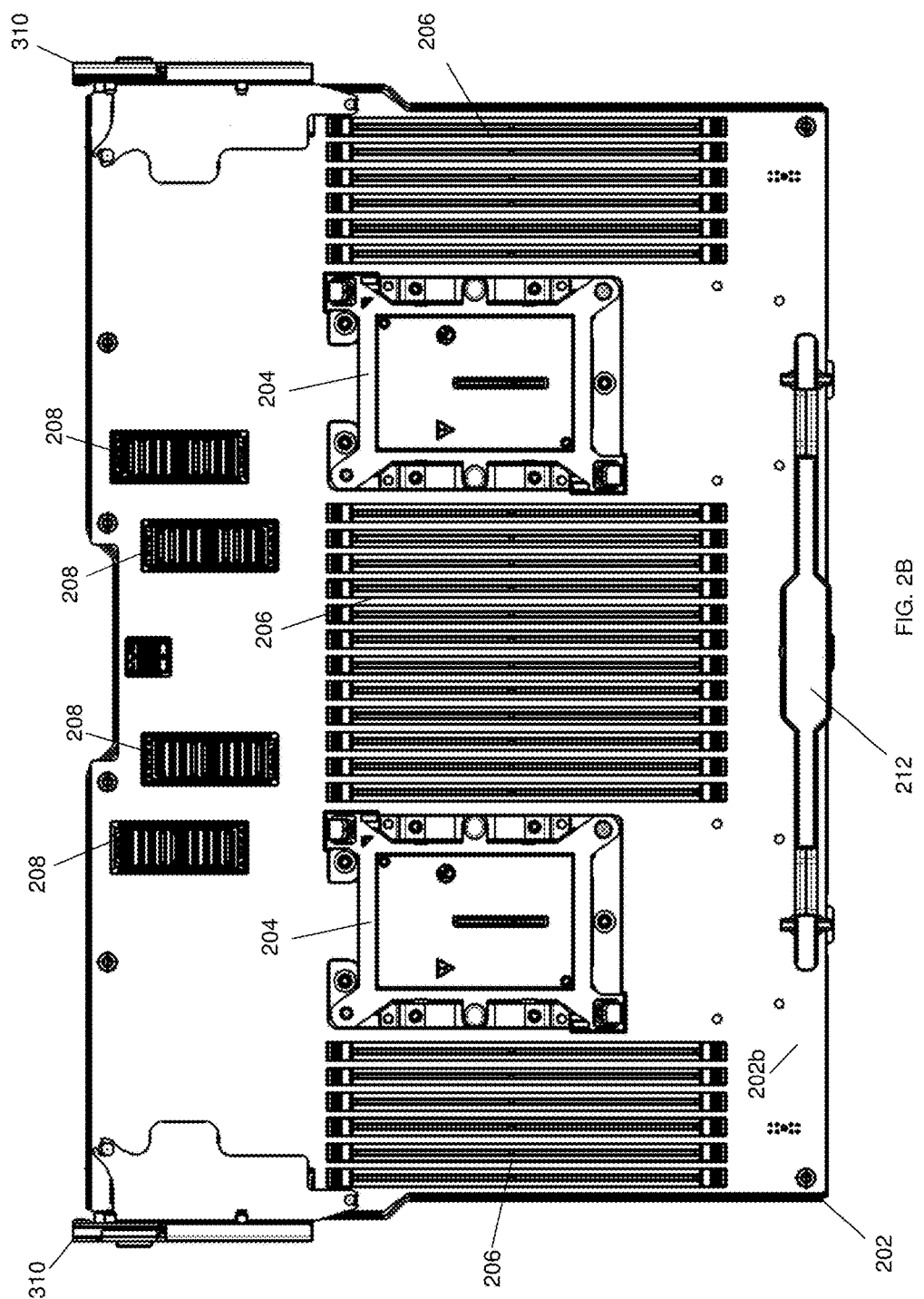
FIG. 2B is a top view illustrating an embodiment of the expansion planar system of FIG. 2A.
Figure 2C:
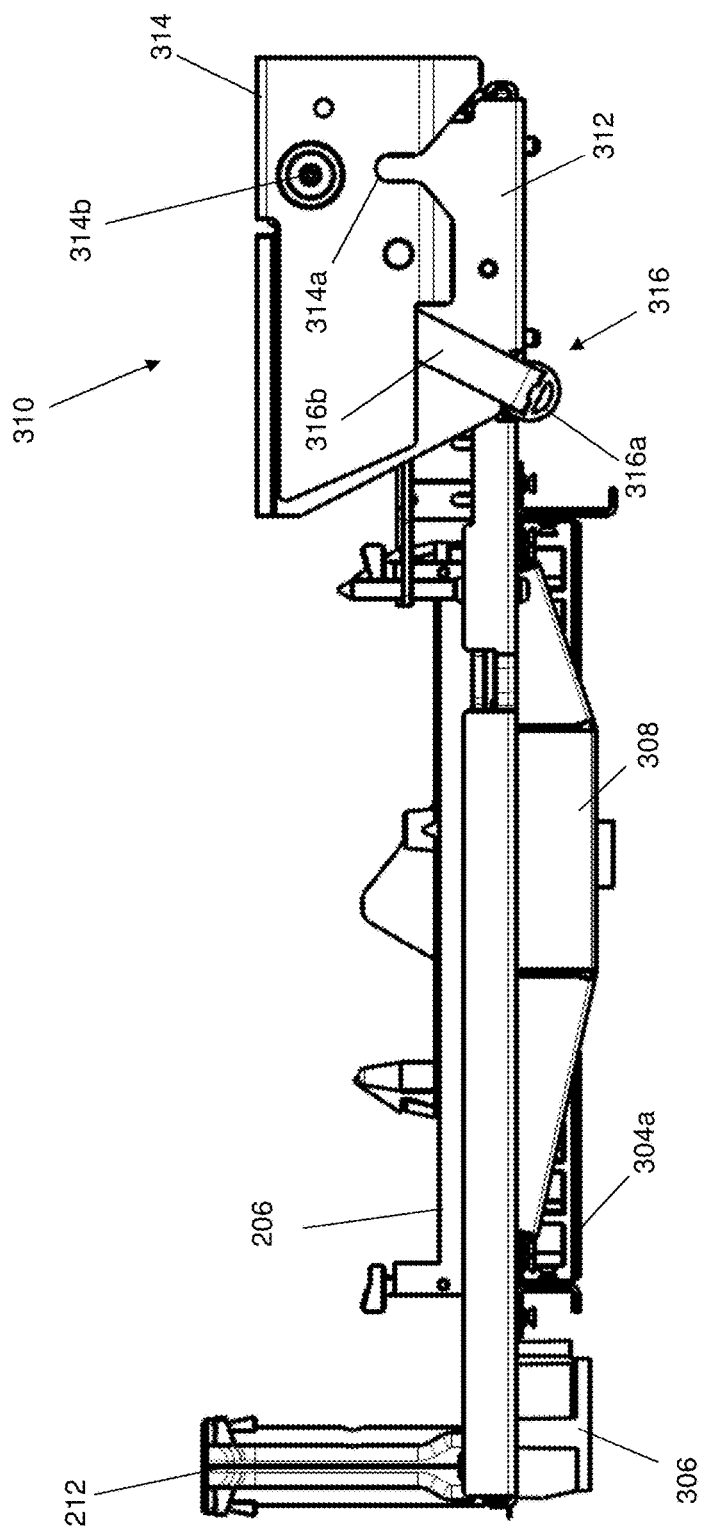
FIG. 2C is a side view illustrating an embodiment of the expansion planar system of FIG. 2A.
Figure 2D:
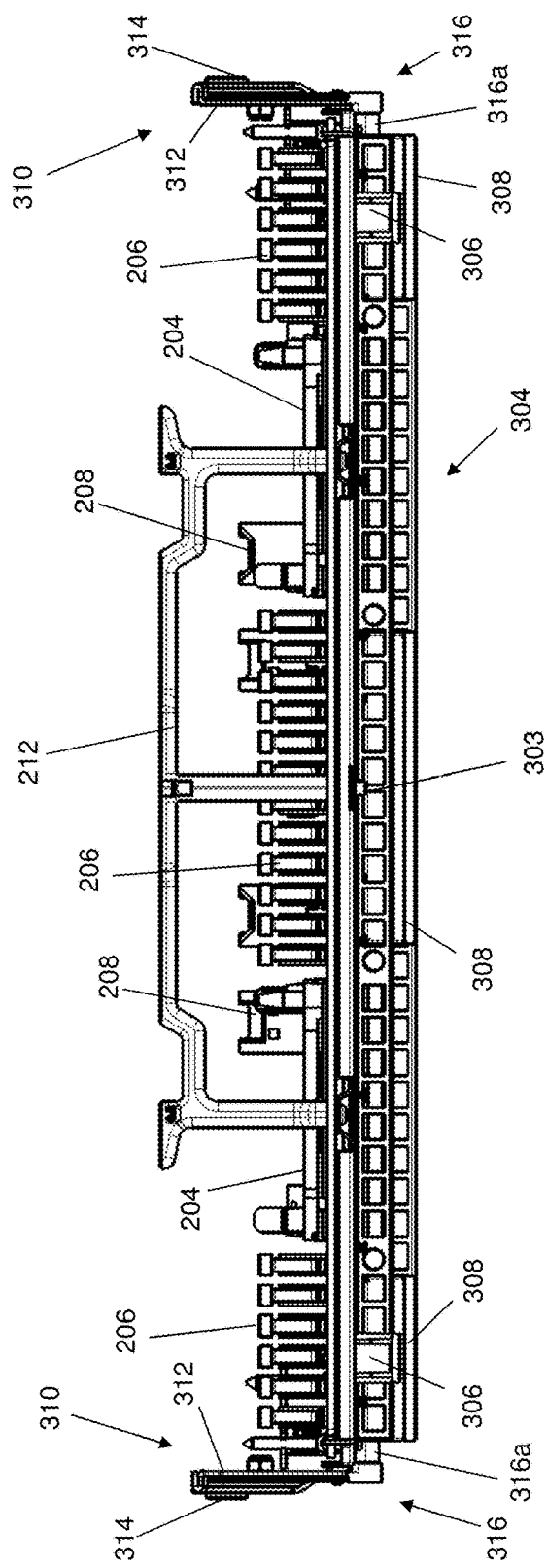
FIG. 2D is a front view illustrating an embodiment of the expansion planar system of FIG. 2A.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIGS. 2A, 2B, 2C, 2D, 3A, 3B, 3C, and 3D, an embodiment of an expansion planar system is illustrated that includes an expansion planar 200, and an expansion planar chassis 300 that is described in more detail with reference to FIGS. 3A-3D. In an embodiment, the expansion planar system is a Processor Expansion Module (PEM) available from DELL® Inc. of Round Rock, Tex., United States, although other types of expansion planar systems will fall within the scope of the present disclosure as well. The expansion planar 200 may include a board 202 that may be provided by a variety of circuit boards known in the art. In the illustrated embodiment, a plurality of expansion planar processing system connectors 204 are mounted to the board 202 and may be provided by a processing system support 204a that is mounted to a bottom surface 202a of the board 202, a processing pin subsystem 204b that is mounted to a top surface 202b of the board 202 opposite the processing system support 204a, and a processing system coupling subsystem 204c that is coupled to the top surface 202b of the board 202 adjacent the processing pin subsystem 204b. A plurality of expansion planar memory system connectors 206 are mounted to the top surface 202b of the board 202 adjacent the processing system connectors 204, and may be coupled to the processing system connectors 204 through the board 202 (e.g., via traces and/or other electrical couplings that would be apparent to one of skill in the art in possession of the present disclosure.)

A plurality of system data connectors 208 are mounted to the top surface 202b of the board 202 adjacent the processing system connectors 204 and the memory system connectors 206, and may be coupled to the processing system connectors 204 and/or the memory system connectors 206 through the board 202 (e.g., via traces and/or other electrical couplings that would be apparent to one of skill in the art in possession of the present disclosure.) Each of the system data connectors 208 may be provided by a data connector pin subsystem 208a that is mounted to the top surface 202b of the board 202, and a data connector guide 208b that is coupled to the top surface 202b of the board 202 adjacent the data connector pin subsystem 208a. A pair of system power connectors 210 are mounted to the bottom surface 202a of the board 202 adjacent the edge 202c and on opposite sides of the board 202 from each other, and may be coupled to the processing system connectors 204, the memory system connectors 206, and/or any of the other components on the board 202 through the board 202 (e.g., via traces and/or other electrical couplings that would be apparent to one of skill in the art in possession of the present disclosure.) An expansion planar handle 212 is mounted to the top surface 202b of the board 202 adjacent an edge 202c of the board 202. While a specific expansion planar 200 has been described, one of skill in the art will recognize that expansion planars that include different components (e.g., storage systems, different connectors, etc.) and/or different component configurations will benefit from the teachings of the present disclosure and thus will fall within its scope as well.

Referring now to FIGS. 3A-3D, the expansion planar chassis 300 is illustrated, and may be provided (at least in part) by a Transverse Electro-Mechanical Pan (TEMPAN), although other expansion planar chassis will fall within the scope of the present disclosure as well. With continued reference to FIGS. 2A-2D, the expansion planar chassis 300 includes a chassis base 302 including an expansion planar insulator 302a located on a top surface 302b of the chassis base 302. The expansion planar 200 may be mounted to the top surface 302b chassis base 302 and in engagement with the expansion planar insulator 302a in order to, for example, protect the expansion planar 200 from experiencing short circuits with the metal that provides the expansion planar chassis 300. In an embodiment, a keying member 303 may be mounted to a bottom surface 302c of the chassis base 302 such that it extends from the bottom surface 302c of the chassis base 302. A structural support subsystem 304 including a plurality of support beams 304a is mounted to the bottom surface 302c of the chassis base 302, and may be configured to support the weight of the expansion planar 200 (e.g., 10-15 lbs in experimental embodiments.) A pair of system power connector guides 306 are coupled to the bottom surface 302c of chassis base 302, and may be oriented and/or configured such that the system power connectors 210 on the expansion planar 200 extend through the chassis base 302 and into the system power connector guides 306 when the expansion planar 200 is mounted to the chassis base 302. A plurality of airflow directing members 308 are mounted to the is mounted to a bottom surface 302c of the chassis base 302 between the support beams 304a that provide the structural support subsystem 304, and may be configured in a variety of manners to direct airflow as discussed below.

Figure 3A:
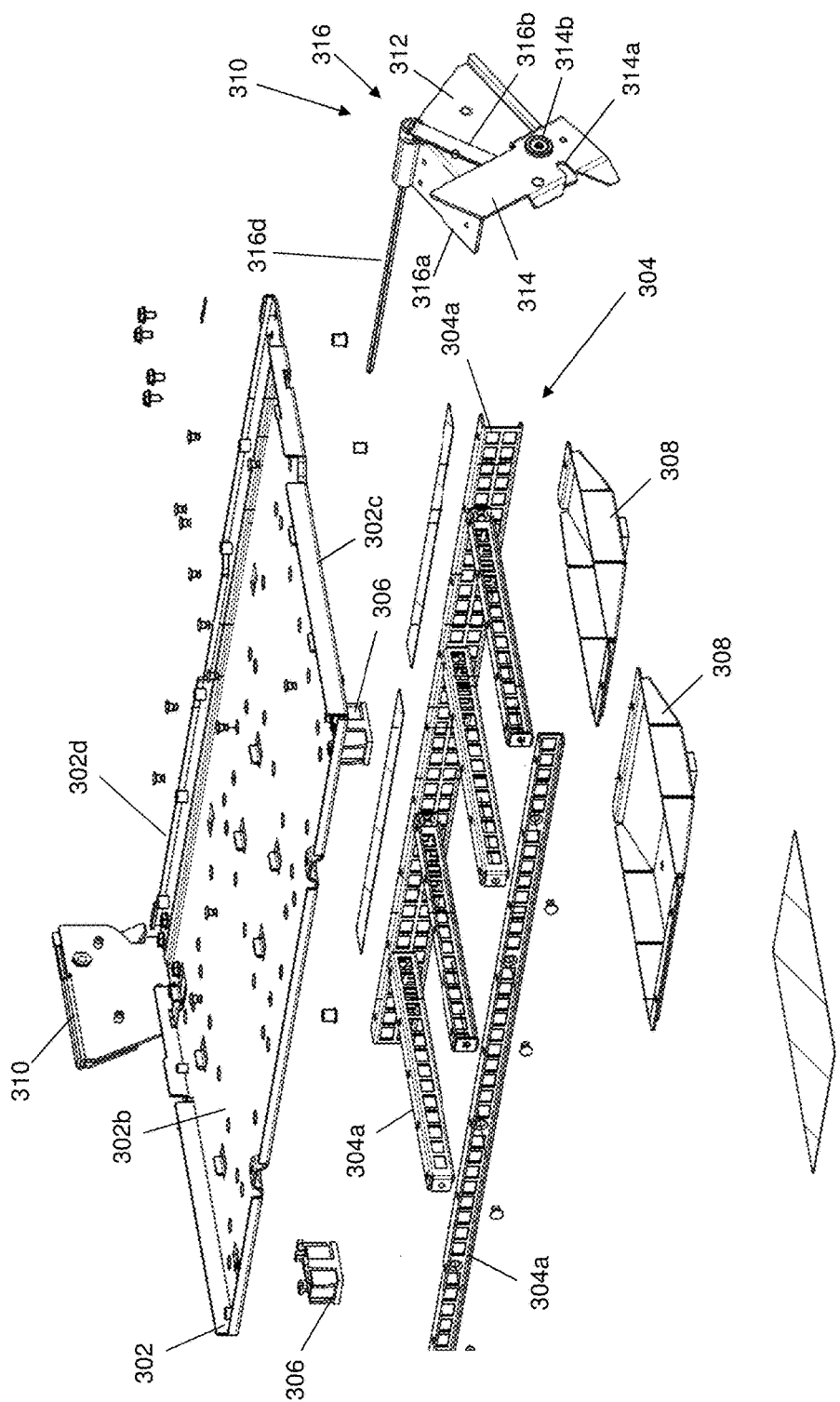
FIG. 3A is an exploded perspective view illustrating an embodiment of a expansion planar chassis included on the expansion planar system of FIG. 2A.
Figure 3B:
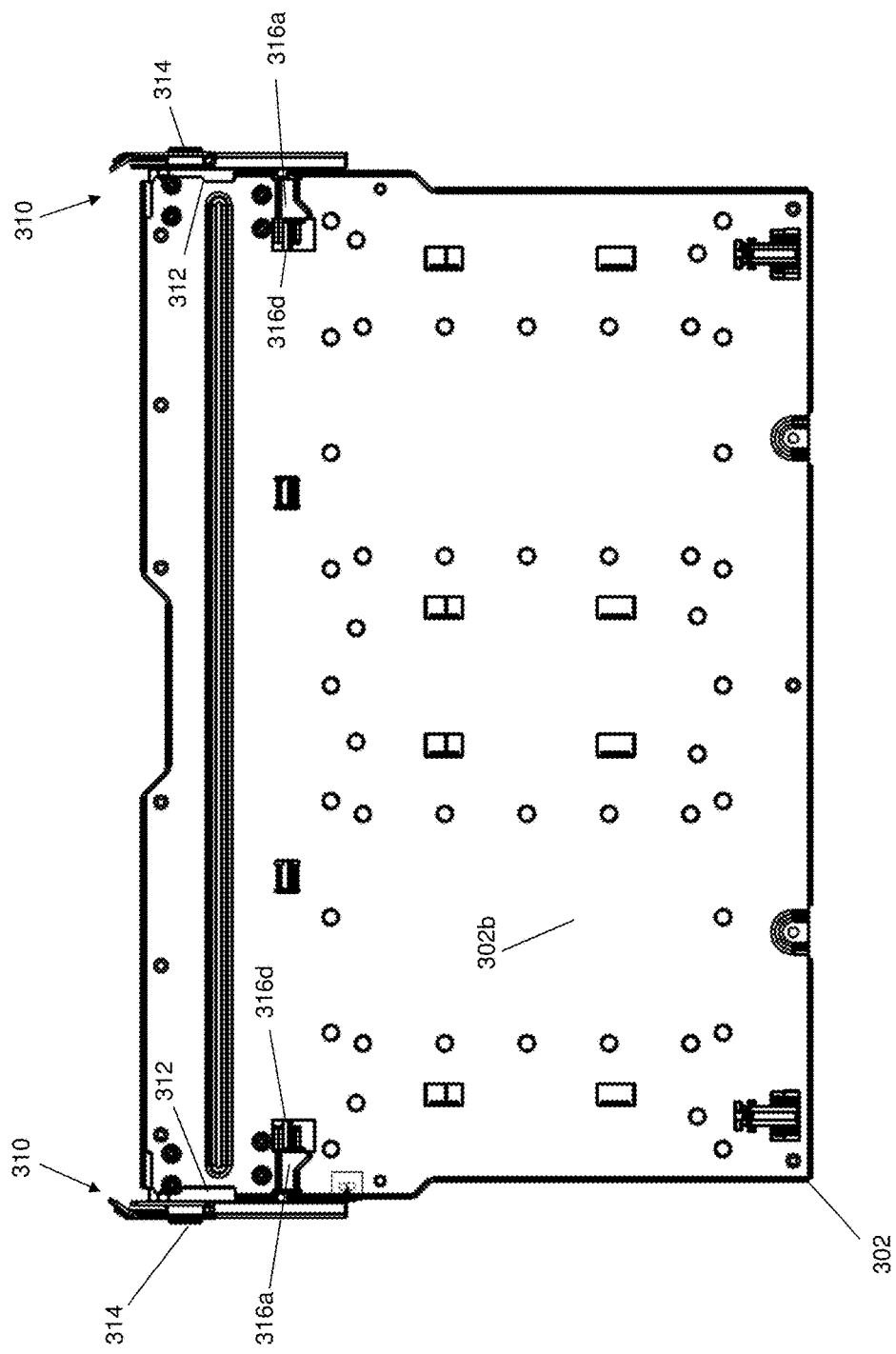
FIG. 3B is a top view illustrating an embodiment of the expansion planar chassis of FIG. 3A.
Figure 3C:
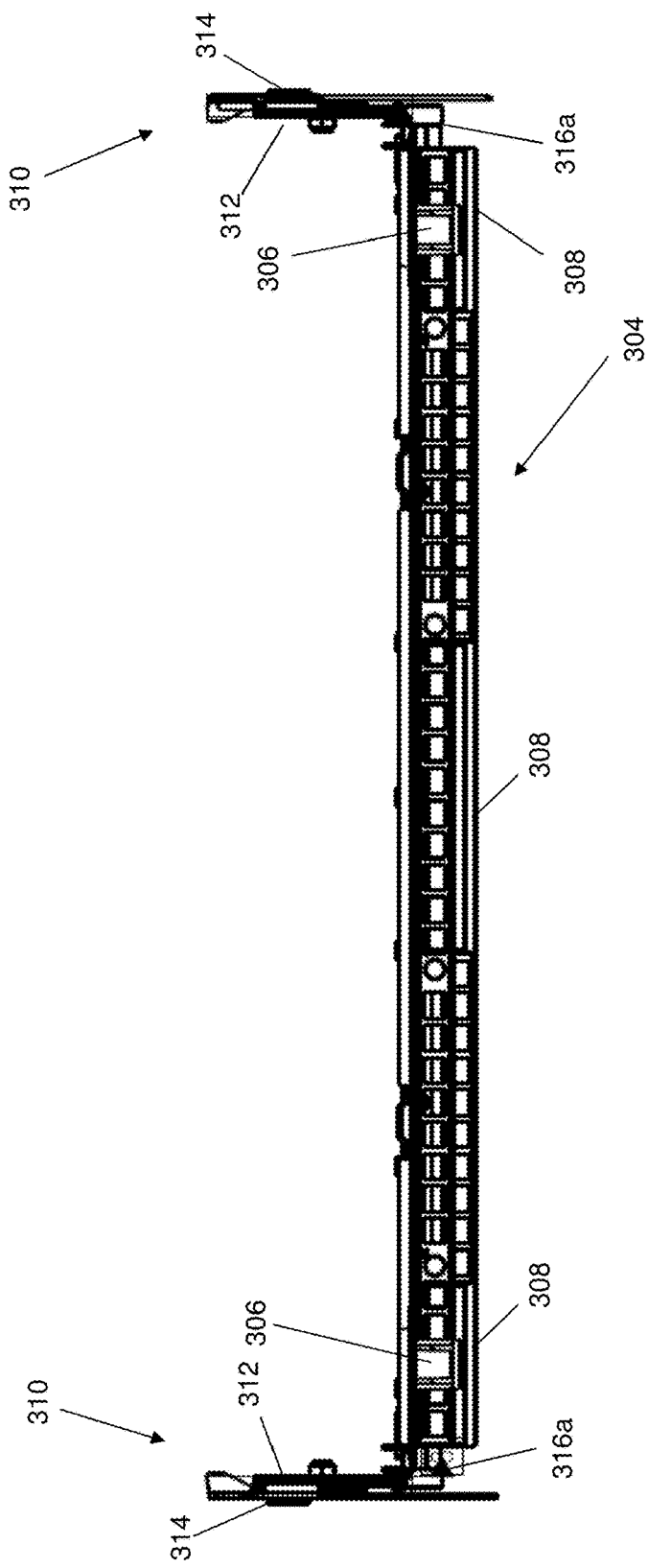
FIG. 3C is a front view illustrating an embodiment of the expansion planar chassis of FIG. 3A.
Figure 3D:
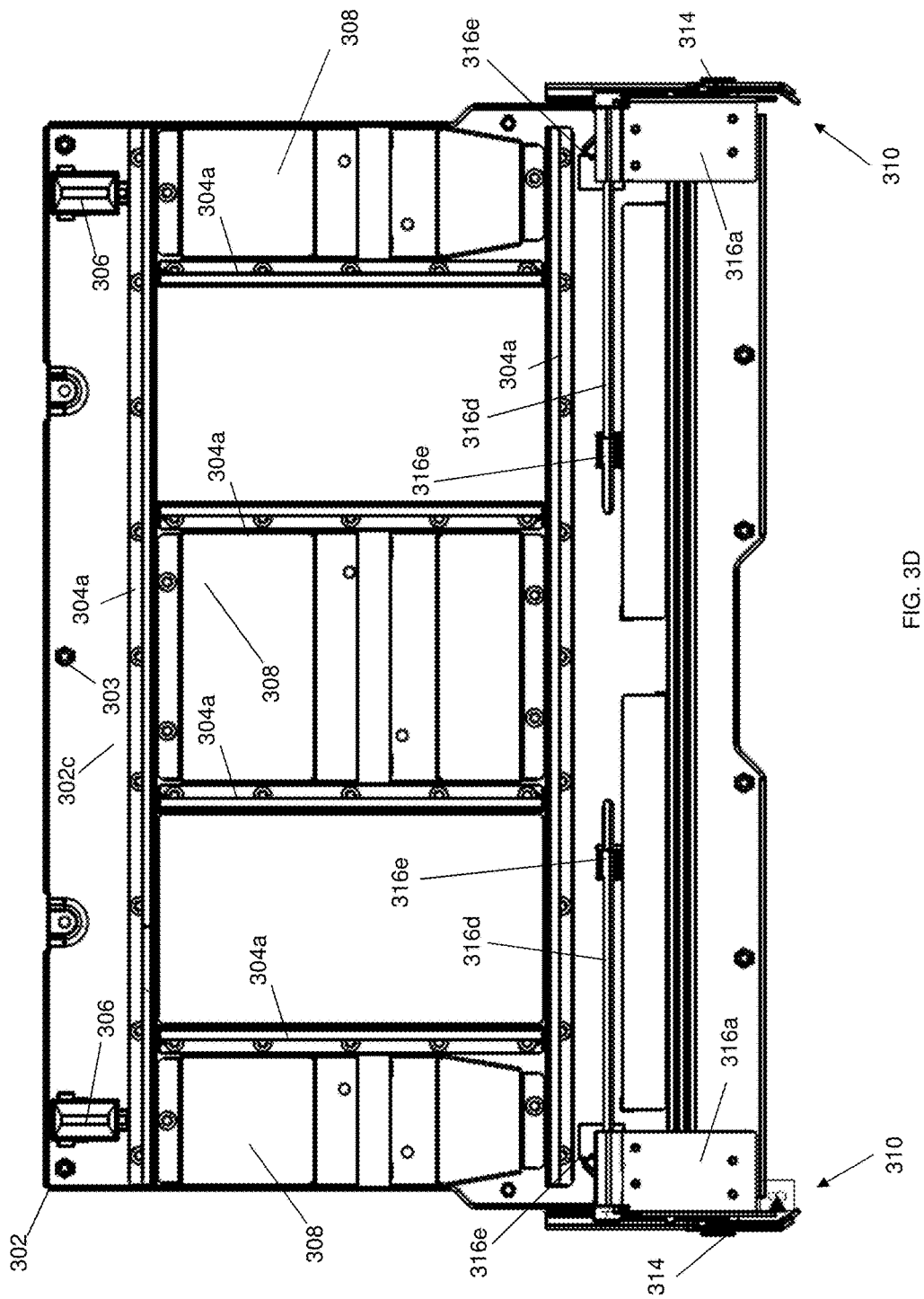
FIG. 3D is a bottom view illustrating an embodiment of the expansion planar chassis of FIG. 3A.
Figure 3E:
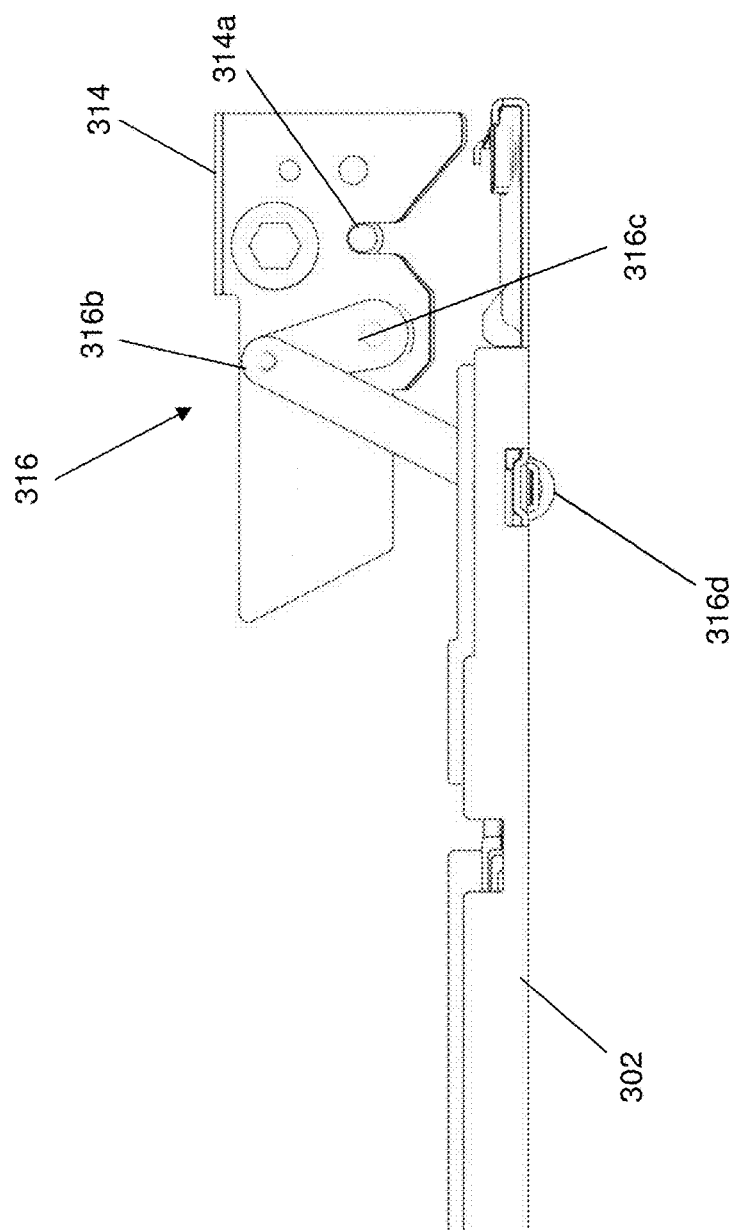
FIG. 3E is a partial view illustrating an embodiment of a system chassis coupling member coupled to a chassis base on the expansion planar chassis of FIG. 3A.

In the illustrated embodiment, a system chassis coupling subsystem is included on the chassis base 302, and in the illustrated embodiment includes a pair of system chassis coupling members 310 that are mounted on opposite sides of the chassis base 302 and adjacent an edge 302d of the chassis base 302. Each of the system chassis coupling members 310 includes a chassis coupling member base 312, a guide element 314 that is mounted to the chassis coupling member base 312, and a rotatable coupling 316 that rotatable coupled to the chassis coupling member base 312. In the embodiments illustrated and discussed below, the guide element 314 defines a guide slot 314a and is coupled to the chassis coupling member base 312 by a connector 314b. Furthermore, in the illustrated embodiment, the rotatable coupling 316 provides a biasing subsystem that includes a mounting plate 316a, a link mechanism 316b that extends from the mounting plate and that is mounted to the guide element 314 by a rotatable connector 316c, and support beam 316d that extends from the mounting plate 316a. In an embodiment, the link mechanism 316b and the support beam 316d may be provided by an integrated L-shaped element that includes a biasing element that, in the discussions below, is provided by a built in torsion spring that is provided on the support beam 316d and coupled to the guide element 314, although other biasing elements may be provided while remaining within the scope of the present disclosure. The system chassis coupling members 310 may be mounted to the chassis base 302 by mounting the mounting plate 316a on the rotatable coupling 316 to the bottom surface 302c of the chassis base 302, with the support beam 316d coupled to the bottom surface 302c of the chassis base 302 (via the mounting features 316e on the chassis base 302 as illustrated in FIG. 3D) to allow the biasing element in the link mechanism 316c to provide the biasing subsystem functionality discussed below. While a specific expansion planar chassis 300 has been described, one of skill in the art will recognize that expansion planar chassis may include different components and/or different component configurations that provide the functionality discussed below while remaining within the scope of the present disclosure.

Figure 4:
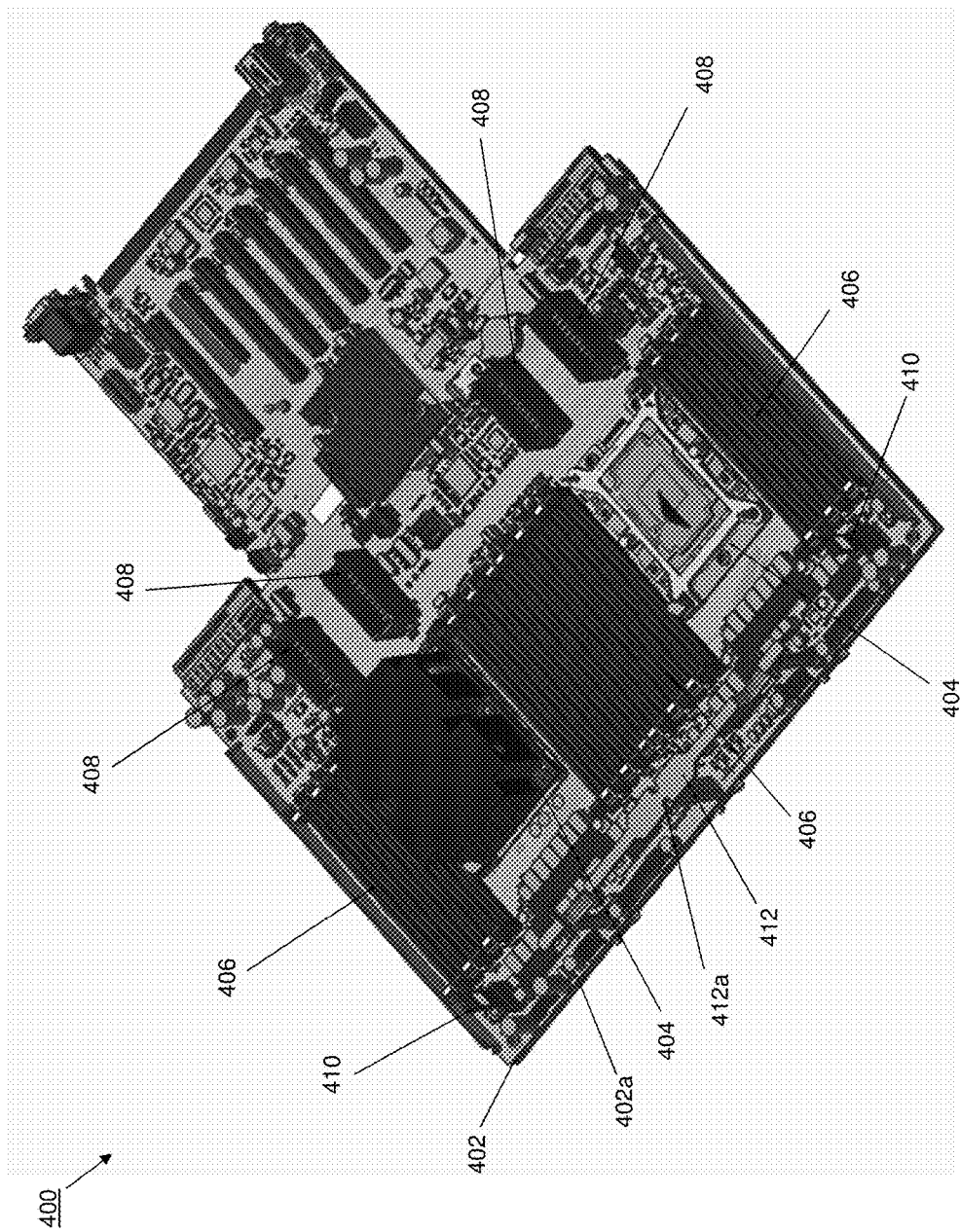
FIG. 4 is a perspective view illustrating an embodiment of a main planar.

Referring now to FIG. 4, an embodiment of a main planar 400 is illustrated. The main planar 300 may include a board 402 that may be provided by a variety of circuit boards (e.g., a motherboard) known in the art. In the illustrated embodiment, a plurality of main planar processing system connectors 404 are mounted to the board 402, and in some embodiments may be provided in substantially the same manner and by substantially similar components as the expansion planar processing system connectors 204 discussed above. A plurality of main planar memory system connectors 406 are mounted to the board 402 adjacent the processing system connectors 404, and may be coupled to the processing system connectors 404 through the board 402 (e.g., via traces and/or other electrical couplings that would be apparent to one of skill in the art in possession of the present disclosure.)

A plurality of main planar data connectors 408 are mounted to the board 402 adjacent the processing system connectors 404 and the memory system connectors 406, may be coupled to the processing system connectors 404 and/or the memory system connectors 406 through the board 402 (e.g., via traces and/or other electrical couplings that would be apparent to one of skill in the art in possession of the present disclosure), and in some embodiments may be provided by in a similar manner and using substantially similar components as the system data connectors 208 discussed above. A pair of expansion power connectors 410 extend from the board 402 adjacent an edge 402a of the board 402 from each other, and may be coupled to a power subsystem in the chassis, as well as to the processing system connectors 404, the memory system connectors 406, and/or any of the other components on the board 402 through the board 402 (e.g., via traces and/or other electrical couplings that would be apparent to one of skill in the art in possession of the present disclosure.) In a specific example, the expansion power connectors may be provided by power stick PWAs, although other expansion power connectors will fall within the scope of the present disclosure as well. A main planar handle 412 is mounted to the board 402 adjacent the edge 402a of the board 402, and defines a keying feature 412a on its top surface. In some embodiments, the main planar handle 412 may be identical to the expansion planar handle 212 discussed above, although the use of different handles will fall within the scope of the present disclosure. While a specific main planar 400 has been described, one of skill in the art will recognize that main planars that include different components (e.g., storage systems, different connectors, etc.) and/or different component configurations will benefit from the teachings of the present disclosure and thus will fall within its scope as well.

Figure 5:
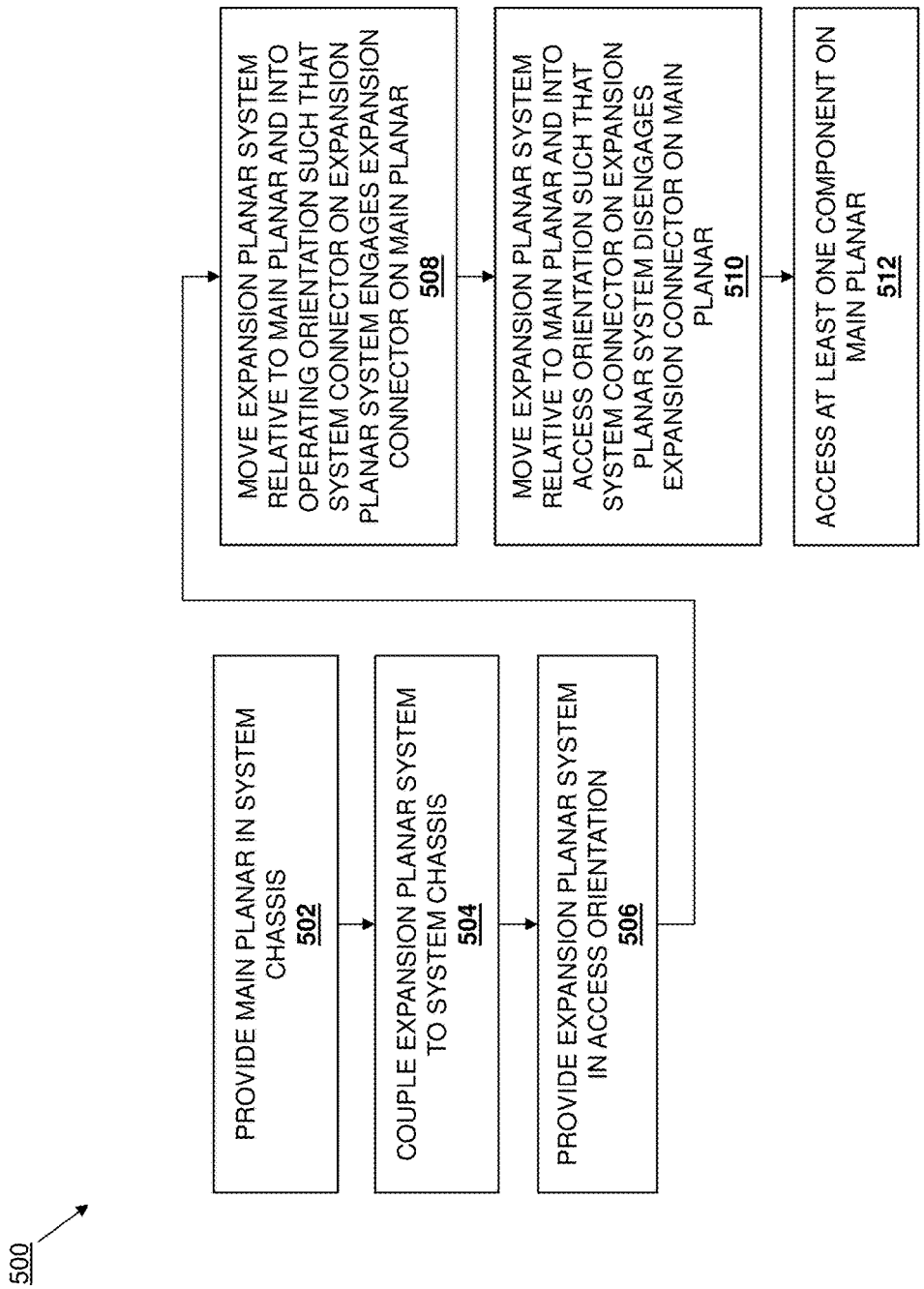
FIG. 5 is a flow chart illustrating an embodiment of a method for providing an expansion planar with a main planar.

Referring now to FIG. 5, an embodiment of a method 500 for coupling an expansion planar to a main planar is illustrated. As discussed below, the systems and methods of the present disclosure provide for the coupling of an expansion planar to a main planar in a system chassis using a robust retention mechanism that supports shock and vibration events while providing an enhanced user experience in accessing components on the main planar. This is accomplished, at least in part, via a system chassis coupling subsystem on the expansion planar chassis that, when coupled to the system chassis, provides for the movement of the expansion planar relative to the main planar, while also ensuring the mating of connector(s) on the expansion planar and the main planar when the two are oriented for use. Furthermore, a biasing subsystem in the system chassis coupling subsystem may operate to maintain the expansion planar system in an open orientation during installation, servicing, and/or main planar access events, while also ensuring that movement of the expansion planar towards the main planar is resisted so that the relatively heavy expansion planar is always rotated towards the main planar in a controlled manner, and also assisting in the movement of the relatively heavy expansion planar away from the main planar. Furthermore, air directing members on the bottom of the expansion planar chassis operate to direct air over components on the main planar when the expansion planar and the main planar are oriented for use. This and other functionality described below provide for the coupling and use of an expansion planar with a system chassis in a manner that provide enhancements over conventional expansion planar systems. The method 500 is described below with reference to FIGS. 6A, 6B, 7A, 7B, and 7C, which provide simplified illustrations of the system components for clarity of discussion. However, one of skill in the art in possession of the present disclosure will recognize that features on each of those components may be referenced in the drawings discussed above to understand how each of those components interact during the method 500 to provide the benefits described below.

Figure 6A:
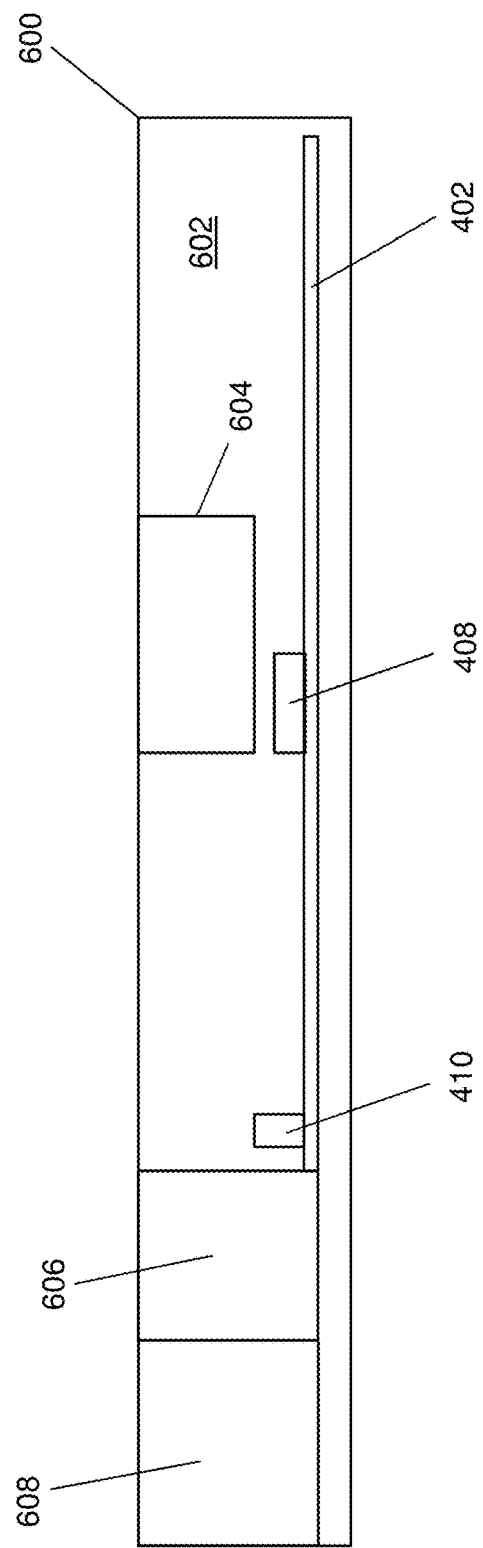
FIG. 6A is a partial cross-sectional side view illustrating an embodiment of the main planar of FIG. 5 included in a chassis.
Figure 6B:
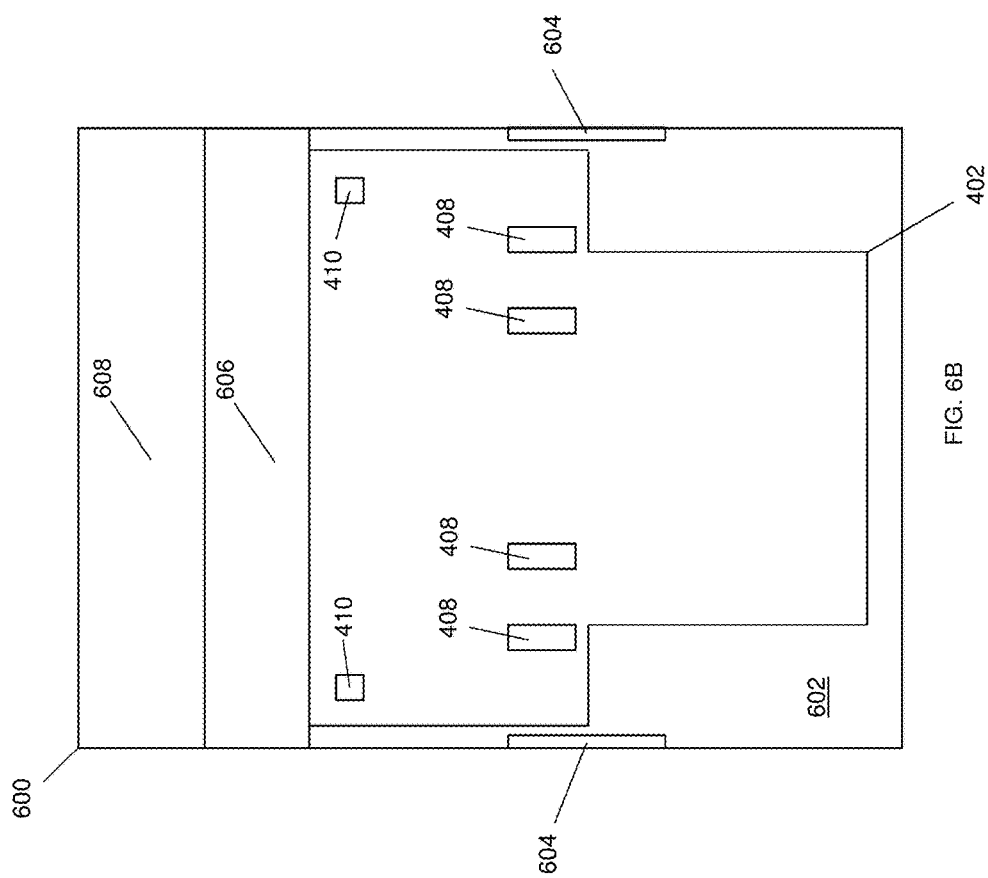
FIG. 6B is a top view illustrating an embodiment of the main planar included in a chassis of FIG. 7A.

The method 500 begins at block 502 where a main planar is provided in a system chassis. Referring now to FIGS. 6A and 6B, in an embodiment of block 502, a system chassis 600 may be provided that defines a chassis housing 602. One of skill in the art in possession of the present disclosure will recognize that the system chassis 600 is illustrated and described below as a server chassis, but that other types of chassis and systems will benefit from the teachings of the present disclosure and thus will fall within its scope as well. In the illustrated embodiment, the main planar 400 is positioned in the chassis housing 602, and while not explicitly illustrated, one of skill in the art in possession of the present disclosure will recognize that the system chassis 600 and the main planar 400 may include coupling and/or securing features for coupling, mounting, and/or securing the main planar 400 in the chassis housing 602 of the system chassis 600. A pair of expansion planar system coupling members 604 are positioned on opposing side walls that are located on either side of the system chassis 600 such that the main planar 402 is located between them when positioned in the chassis housing 602 as illustrated. In the illustrated embodiment, a fan system 606 is positioned immediately adjacent the main planar 400, and in some embodiments may engage the main planar 400 to assist in supporting the main planar 400 during shock and vibrations events that may be experienced by the system chassis 600.

In addition, a storage system 608 is positioned in the chassis housing 602 opposite the fan system 606 from the main planar 400, and one of skill in the art in possession of the present disclosure will recognize how cabling may be routed through the chassis housing 602 in order to connect components in the chassis housing 602 (e.g., storage devices in the storage system 608) to the main planar 400. While not illustrated, main planar processing systems may be provided (i.e., connected to the processing system connectors 404) on the main planar, main planar memory systems may be provided (i.e., coupled to the memory system connectors 406) on the main planar, and/or any of a variety of other components may be coupled to or connected to the main planar 400 when the main planar 400 is positioned in the system chassis 200. One of skill in the art in possession of the present disclosure will recognize that the system chassis 200 including the main planar 400 may provide a base-level computing system (e.g., a server) that is configured to provide a base level of computing functionality (e.g., via the components provided on the main planar), but may also be configurable to provide an enhanced-level computing system with an enhanced level of computing functionality via connection of the expansion planar system 300 to the system chassis 600 and main planar 400 as discussed in further detail below.

Figure 7C:
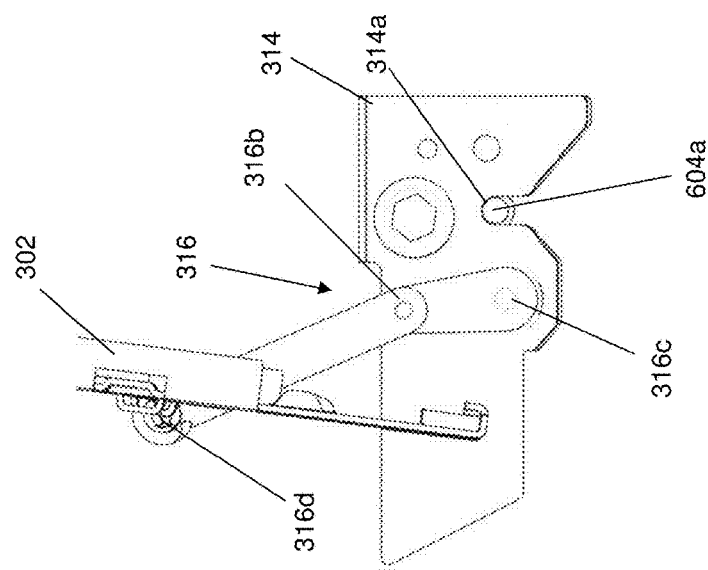
FIG. 7C is a partial view illustrating an embodiment of a system chassis coupling member of FIG. 3E providing for rotation of the expansion of the expansion planar system of FIGS. 2A-2D and 3A-3E.

The method 500 then proceeds to block 504 where an expansion planar system is coupled to the system chassis. With reference to FIG. 7A, in an embodiment of block 504, an expansion planar system 700, which may be substantially similar to the expansion planar system discussed above with reference to FIGS. 2A-2D and 3A-3D and thus includes common reference numbers for common features in FIGS. 7A-7C, is positioned adjacent the system chassis 600 such that the system chassis coupling members 310 on the expansion planar chassis 300 are aligned with the expansion planar system coupling members 604 on the system chassis 600. For example, the expansion planar system coupling members 604 may include pegs, hooks, and/or other alignment features that are configured to engage the guide slots 314a on each of the system chassis coupling members 310, and at block 504, the expansion planar system 700 may be positioned adjacent the chassis housing 602 on the system chassis 600 such that the guide slots 314a are aligned with respective alignment features on the expansion planar system coupling members 604 that are configured to enter those guide slots 314a. Furthermore, while not explicitly illustrated, each of the expansion planar system coupling members 604 and the system chassis coupling members 310 may include features for coupling and securing the expansion planar system 700 to the system chassis 600 and in the chassis housing 602 without the use of a tool (e.g., latches, snaps, and/or other tool-less coupling features known in the art.) However, one of skill in the art in possession of the present disclosure will recognize that the expansion planar system coupling members 604 and the system chassis coupling members 310 may include a variety of features for providing the alignment, coupling, and securing functionality discussed below while remaining within the scope of the present disclosure.

Figure 7D:
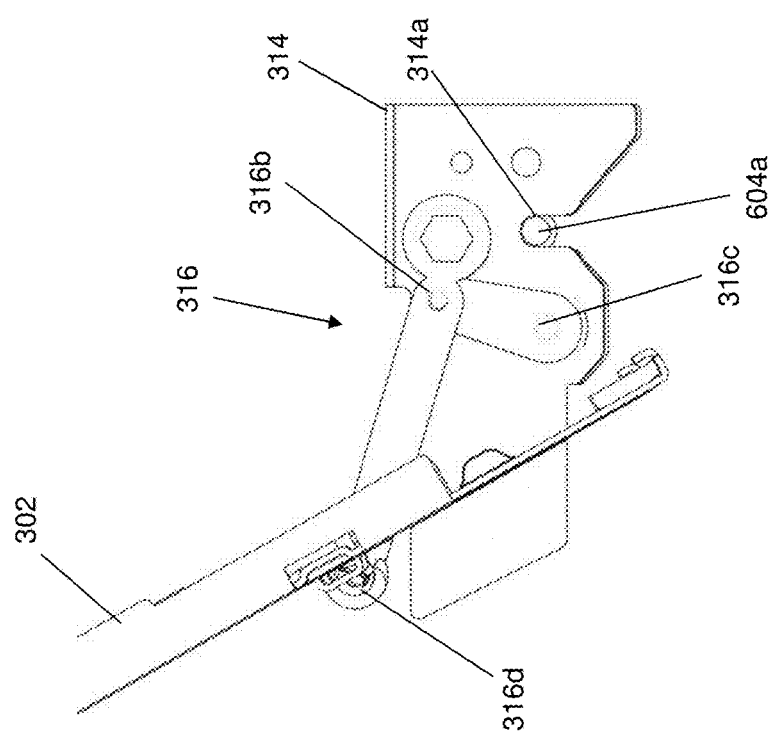
FIG. 7D is a partial view illustrating an embodiment of a system chassis coupling member providing for rotation of the expansion of the expansion planar system of FIGS. 2A-2D and 3A-3E.
Figure 7E:
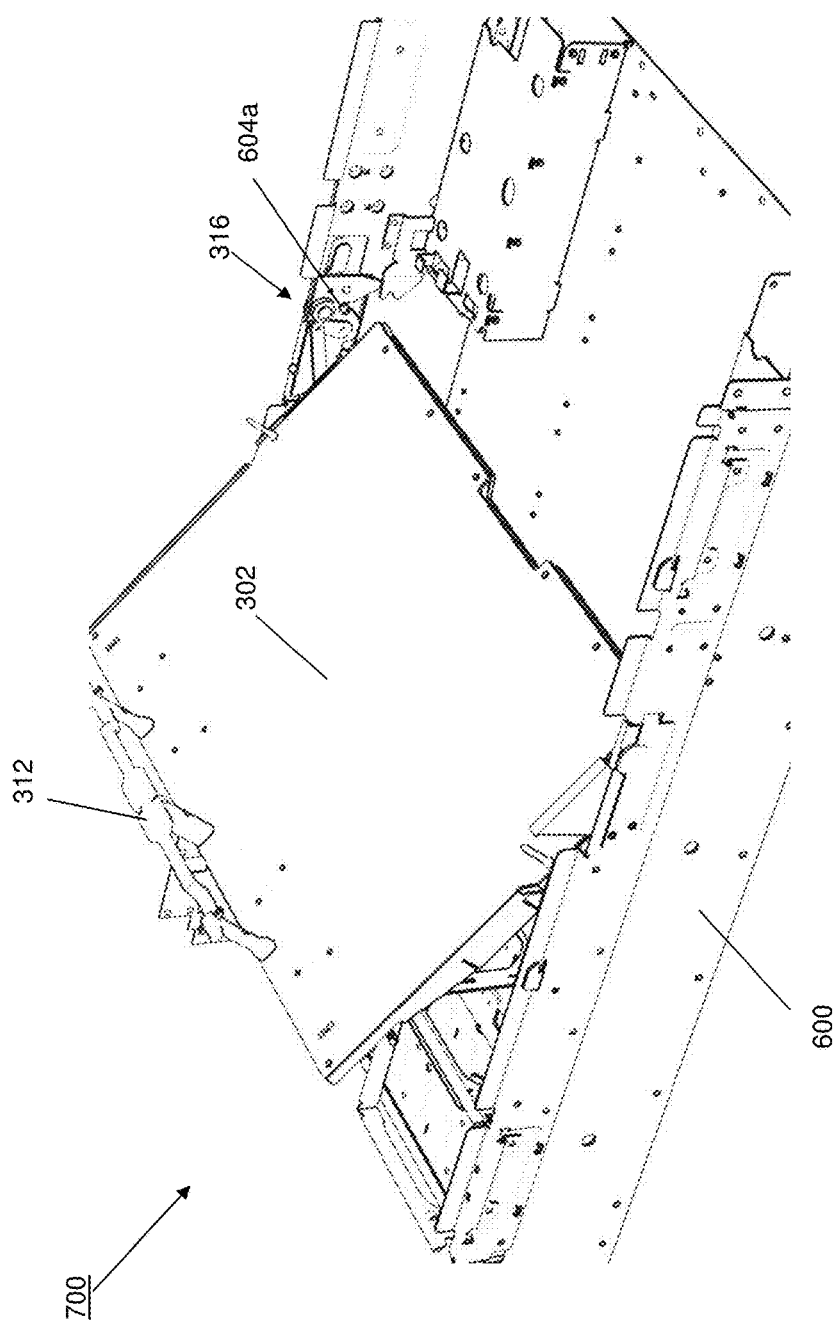
FIG. 7E is a perspective view illustrating an embodiment of the expansion planar system of FIGS. 2A-2D and 3A-3E being rotated towards the main planar of FIG. 4.
Figure 7F:
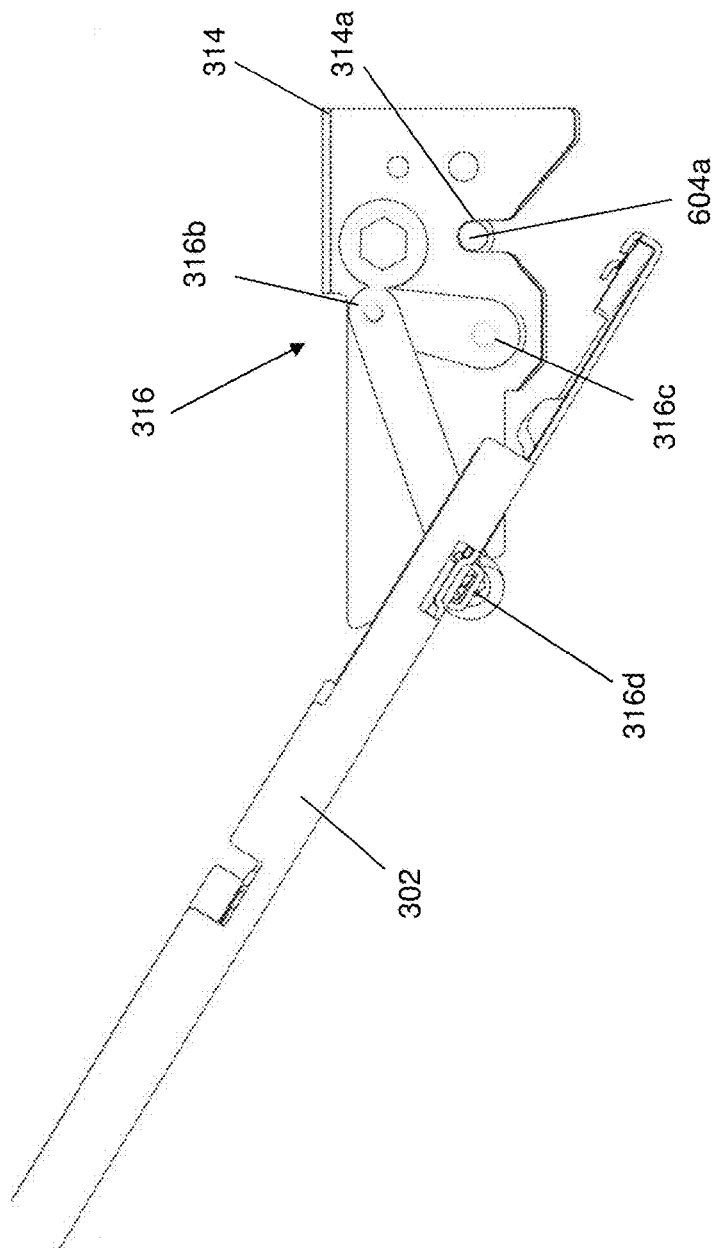
FIG. 7F is a partial view illustrating an embodiment of a system chassis coupling member providing for rotation of the expansion of the expansion planar system of FIGS. 2A-2D and 3A-3E.
Figure 7G:
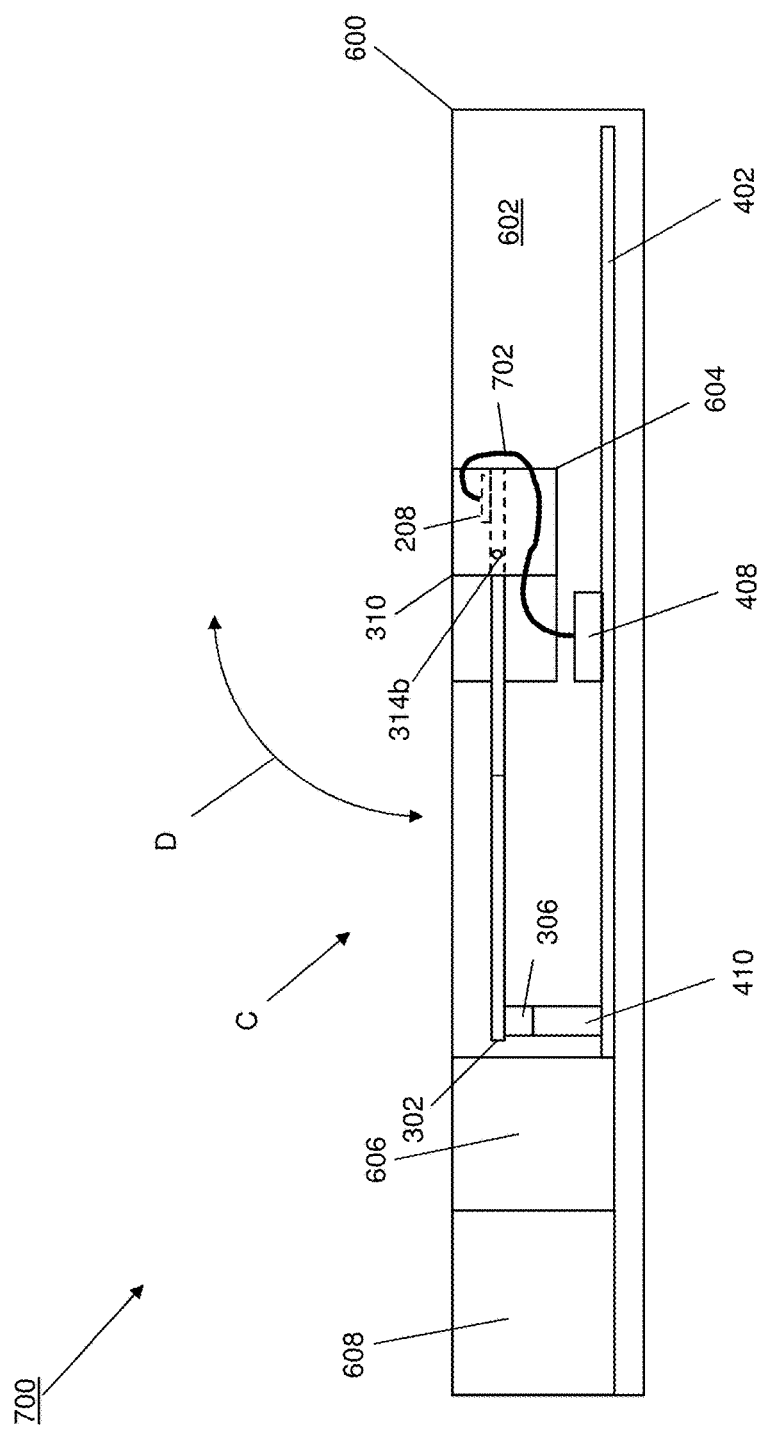
FIG. 7G is a side view illustrating an embodiment of the expansion planar system of FIGS. 2, 3A-3D, and 4A-4C rotated to engage connectors on the main planar to allow the expansion planar and the main planar to operate together.
Figure 7H:
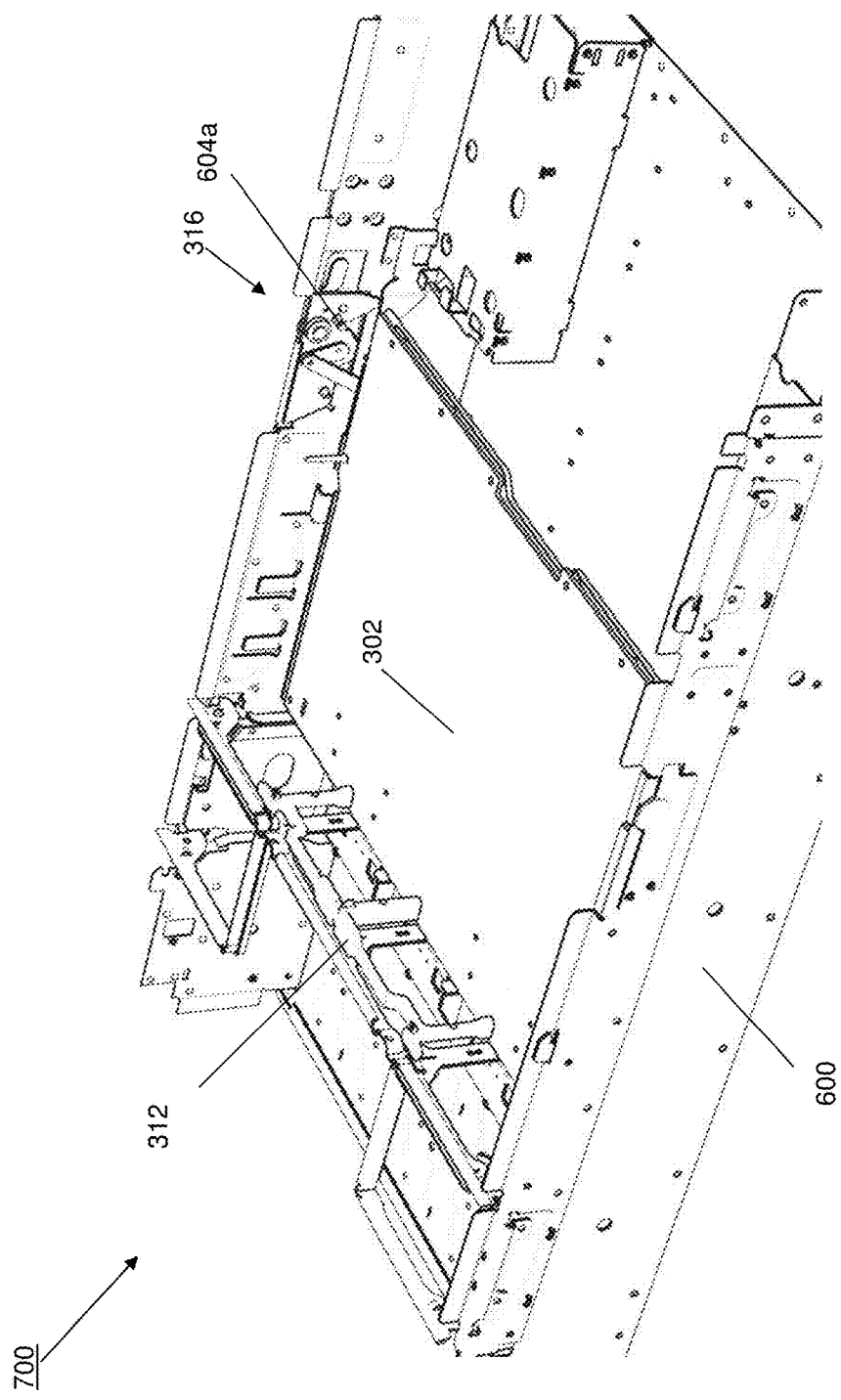
FIG. 7H is a perspective view illustrating an embodiment of the expansion planar system of FIGS. 2A-2D and 3A-3E rotated in a manner that provides for engagement of connectors on the main planar to allow the expansion planar and the main planar to operate together.

With reference to FIGS. 7A, 7B, and 7C, the expansion planar system 700 is then moved in a direction A and into the chassis housing 602, which causes alignment features 604 on the expansion planar system coupling members 604 to enter and move through the respective guide slots 314a on the respective system chassis coupling members 310, and results in the alignment of the expansion planar 200 and the main planar 400, while also securing the expansion planar chassis 300 (and thus the expansion planar 200) in the chassis housing 602 of the system chassis 600 via the engagement of the securing features on the system chassis coupling members 310 and the expansion planar system coupling members 604. In the embodiment illustrated in FIGS. 7B and 7C, the expansion planar system 700 is illustrated in an access orientation B in which the expansion planar 200 is substantially perpendicular with the main planar 400. However, one of skill in the art in possession of the present disclosure will recognize that the expansion planar system 700 may be coupled to the system chassis 600 in an intermediate orientation between the access orientation B and a operating orientation C (illustrated in FIGS. 7D, 7E, and 7F, discussed below) in order to, for example, ensure alignment of the expansion planar 200 and main planar 400 (and thus the alignment of the expansion power connectors 410 and the system power connectors 210) before attempting to connect the expansion power connectors 410 and the system power connectors 210.

As illustrated in FIG. 7B, upon coupling the expansion planar system 700 to the system chassis 600, a user may provide cabling to connect the expansion planar 200 to the main planar 400. For example, a respective data cable 702 (e.g., an UltraPath Interconnect (UPI) cable) may be connected to each of a respective system data connector 208 on the expansion planar 200 and a respective main planar data connector 408 on the main planar 400. As can be seen in the illustrated embodiment, the data cables 702 extend opposite the rotatable couplings from the expansion planar 200, which as illustrated below provides for the movement of the expansion planar 200 relative to the main planar 400 without interference from the data cables 702. While the connectors 208 and 408 and the cables 702 are described herein as transmitting data communications between the expansion planar 200 and the main planar 400, one of skill in the art in possession of the present disclosure will recognize that any of a variety of electrical transmissions (e.g., power transmissions, other types of communication transmission, etc.) may be transmitted via the connectors 208 and 408 and the cables 702 while remaining within the scope of the present disclosure. Furthermore, while a cabled connection between the data system data connectors 208 and the main planar data connectors 408 is illustrated and described herein, in other embodiments, the system data connectors 208 and the main planar data connectors 408 may be configured (similarly to the system power connectors 210 and the expansion power connectors 410 discussed below) to provide for the blind mating of the system data connectors 208 and the main planar data connectors 408 when the expansion planar system 702 is moved into the operating orientation C.

Thus, while an expansion planar system that utilizes a blind-mate power connection along with a cabled data connection are illustrated herein, an expansion planar system that provides all necessary expansion planar/main planar connections in response to movement of the expansion planar system into the operating orientation is explicitly envisioned as falling within the scope of the present disclosure as well. While not explicitly illustrated, components may be coupled to the expansion planar 200 (either prior to or subsequent to the coupling of the expansion planar system 700 to the system chassis 600.) For example, expansion planar processing systems may be connected to the expansion planar processing system connectors 204, expansion planar memory systems may be coupled to the expansion planar memory system connectors 206, and/or any other expansion planar components may be connected to the expansion planar 200 while remaining within the scope of the present disclosure. Further still, while not explicitly illustrated or described in detail below, one of skill in the art in possession of the present disclosure will recognize that the system chassis 600 may include release features (e.g., buttons, levers, latches, etc.) that may be actuated by a user to disengage the securing features discussed above. As such, the expansion planar system 700 may be removed from the chassis housing 602 by disengaging the securing features and moving the expansion planar system 700 in a direction opposite the direction A in FIG. 7A.

The method 500 then proceeds to block 506 where the expansion planar system is provided in an access orientation such that the expansion planar system is rotated away from and substantially perpendicular to the main planar. FIGS. 7B and 7C illustrate the expansion planar system 700 in the access orientation B in which the expansion planar 200 is oriented substantially perpendicular to the main planar 400. While the access orientation B is illustrated and described as being provided during the coupling of the expansion planar system to the system chassis 600, as discussed below, the expansion planar system may be provided in the access orientation B (e.g., by rotating the expansion planar chassis 302 about the rotatable couplings as discussed below) following the coupling of the expansion planar system to the system chassis 600 in an intermediate orientation (between the access orientation B and the operating orientation C illustrated in FIGS. 7D-F) while remaining within the scope of the present disclosure.

When in the access orientation, the biasing subsystem provided in the rotatable couplings 316 of the system chassis coupling members 310 operates to provide a force on the expansion planar chassis 302 that holds the expansion planar system in the access orientation B and resists movement of the expansion planar system out of the access orientation B that may result from unexpected forces on the system chassis 600 (e.g., to a protect a user servicing the system chassis components.) For example, in each of the system chassis coupling members 310, the biasing element (e.g., a torsion spring) provided on the support beam 316d may transmit a force between the system chassis 600 (e.g., via the guide element 314 that is coupled to the system chassis 600) and the chassis base 302 (e.g., via the coupling of the mounting plate 316a and support beam 316d to the chassis base 302) that resists movement of the expansion planar system 700 out of the access orientation B. That force may be configured based on the weight of the expansion planar chassis 300/expansion planar 200 (e.g., 10-15 lbs in experimental embodiments), and is provided to prevent the expansion planar system from unexpectedly closing (i.e., moving from the access orientation B to the operating orientation C) on a user. In an embodiment, the link mechanism 316c and support beam 316d provide a 4-bar link mechanism (including the integrated torsion spring) that may be configured to vary the biasing force that resists movement of the expansion planar system 700 out of the access orientation B, with that varying biasing force at a maximum when the expansion planar system 700 is in the access orientation B, while reducing as the expansion planar system 700 moves towards the operating orientation C. In an embodiment, frictional elements may be provided in the link mechanism 316b on the rotational coupling 316 to allow for the rotational coupling to hold the expansion planar system 700 in a variety of intermediate orientation between the access orientation B and the operating orientation C.)

The method 500 then proceeds to block 508 where the expansion planar system is moved relative to the main planar and into an operating orientation such that the system connector on the expansion planar system engages the expansion connector on the main planar. With reference to FIGS. 7D, 7E, 7F, 7G, and 7H, in an embodiment of block 508 the expansion planar system 700 may be rotated from the access orientation B towards the main planar 400 and into the operating orientation C, and which may be provided by rotating the chassis base 302 on the expansion planar chassis 300 about the rotatable couplings 316 provided by the system chassis coupling members 310 and along an arc D. As such, in an embodiment of block 508, the expansion planar system 700 may be rotated along at least a portion of that arc D from the access orientation B (or from the intermediate orientations between the access orientation B and the operating orientation C, illustrated in FIGS. 7D-F) towards the main planar 400 and into the operating orientation C. When rotating the expansion planar system 700 into the operating orientation C, the biasing subsystem operates to provide a force on the expansion planar chassis 302 that is opposite the direction of rotation along the arc D and towards the first orientation B. Similarly as described above, in each of the system chassis coupling members 310, the biasing element (e.g., a torsion spring) coupled to the support beam 316d may transmit a force between the system chassis 600 (e.g., via the guide element 314 coupled to the system chassis 600) and the chassis base (e.g., via the coupling of the mounting plate 316a and support beam 316d to the chassis base 302) that resists movement of the expansion planar system 700 into the operating orientation C. That force may be configured based on the weight of the expansion planar chassis 300/expansion planar 200 (e.g., 10-15 lbs in experimental embodiments), and is provided to ensure the movement of the expansion planar system 700 into the operating orientation C is accomplished in a controlled manner.

As discussed above, the engagement of the system chassis coupling members 310 on the expansion planar chassis 300 with expansion planar system coupling members 604 on the system chassis 600 aligns the expansion planar 200 and the main planar 400 and, more specifically, aligns the system power connectors 210 on the expansion planar 200 with the expansion power connectors 410 on the main planar 400 in this embodiment, such that the rotation of the expansion planar system 700 into the operating orientation C provides for the blind mating of the system power connectors 210 and the expansion power connectors 410. Furthermore, in some embodiments, the keying feature 412a on the main planar handle 412 operates to engage the keying member 303 on the expansion planar chassis 300 as the expansion planar system reaches the end of the arc D and enters the operating orientation C to provide support for the expansion planar chassis 300 during shock and vibration events, and may also act to provide for fine alignment of the system power connectors 210 and the expansion power connectors 410 immediately prior to their engagement.

With the system power connectors 210 on the expansion planar 200 engaging the expansion power connectors 410 on the main planar 400, as well as the system data connectors 208 coupled to the main planar data connectors 408, as illustrated in FIG. 7C, the expansion planar 200 is coupled to the main planar 400 to provide for expanded computing functionality. For example, as illustrated in the embodiments above, the connection of the expansion planar system 700 to the main planar 400 expands the computing functionality of the system included in the system chassis 600 by doubling its number of processing systems and memory systems. However, the expansion of storage functionality and/or other non-processing functionality will fall within the scope of the present disclosure as well. Furthermore, the positioning of the expansion planar system 700 in the operating orientation C provides the air directing members 308 on the bottom surface 302c of the expansion planar chassis 300 adjacent components on the main planar 400 (e.g., the main planar processing systems and main planar memory systems discussed above), and may be configured to direct air over those components to provide sufficient cooling of those components. For example, the air directing members 308 may be shaped such that airflow created through the chassis housing 602 by the fan system 606 focuses air on the main planar processing systems and main planar memory systems that are located on the main planar 400. Further still, features on the expansion planar subsystem (e.g., the expansion planar handle 212 mounted to the expansion planar 200) may engage a top cover (not illustrated) provided on the system chassis 600 in order to help protect against shock and vibration events that may be experienced by the system chassis 600.

The method 500 then proceeds to block 510 where the expansion planar system is moved relative to the main planar and into the access orientation such that the system connector on the expansion planar system disengages the expansion connector on the main planar. In an embodiment, at block 510, the expansion planar system 700 may be rotated along the arc D from the operating orientation C and into the access orientation B by, for example, providing a force on the expansion planar handle 212. One of skill in the art in possession of the present disclosure will recognize that initial movement of the expansion planar system 700 out of the operating orientation C will cause the system power connectors 210 on the expansion planar 200 to disengage the expansion power connectors 410 on the main planar 400. Furthermore, when rotating the expansion planar system 700 into the access orientation B, the biasing subsystem operates to provide a force on the expansion planar chassis 302 that is in the direction of rotation along the arc D and towards the access orientation B. Similarly as discussed above, in each of the system chassis coupling subsystems 310, the biasing element (e.g., a torsion spring) in the support beam 316d may transmit a force between the system chassis 600 (e.g., via the guide element 314 coupled to the system chassis 600) and the chassis base (e.g., via the coupling of the mounting plate 316a and support beam 316d to the chassis base 302) that assists movement of the expansion planar system 700 into the access orientation B. That force may be configured based on the weight of the expansion planar chassis 300/ expansion planar 200 (e.g., 10-15 lbs in experimental embodiments), and operates to assist a user in moving the expansion planar system 700 into the access orientation B, particularly when the expansion planar system 700 is relatively heavy.

The method 500 then proceeds to block 512 where at least one component on the main planar is accessed. As illustrated in FIG. 7B, with the expansion planar system 700 in the access orientation B such that the expansion planar 200 is substantially perpendicular to the main planar 400, components on the main planar 400 are accessible. Thus, in an embodiment of block 512, a user may access any of the components included on the main planar 400. For example, the user may access the main planar processing systems, the main planar memory systems, and/or any other main planar components that are included on the main planar 400. Furthermore, in some embodiments of block 512, the user may decouple the system data connectors 208 on the expansion planar 200 from the main planar data connectors 408 on the main planar 400 (e.g., by disconnecting the cables 702 from either or both of those connectors 208/408) in order to, for example, prepare for decoupling of the expansion planar system 700 and the system chassis 600. Furthermore, one of skill in the art in possession of the present disclosure will recognize how the expansion planar system 700 may be rotated between the access orientation B and the operating orientation C in order to access the main planar 400 and/or components in the chassis housing 602, and then to reconnect the expansion planar 200 to power so that the expansion planar 200 and the main planar 400 may be used to provide the expanded computing functionality discussed above.

Thus, systems and methods have been described that provide for the coupling of an expansion planar to a main planar in a system chassis in a manner that provides an enhanced user experience in accessing components on the main planar by allowing for the movement of the expansion planar relative to the main planar while also ensuring the blind mating of connector(s) on the expansion planar and the main planar when the two are oriented for use. A biasing subsystem in the system chassis coupling subsystem ensures that the expansion planar system remains in an access orientation and does not close unexpectedly, while resisting movement of the expansion planar towards the main planar and assisting movement of the expansion planar away from the main planar so that the relatively heavy expansion planar may be rotated in a user-friendly manner. In addition, air directing members may be provided on the bottom of the expansion planar chassis in situations where directing air over components on the main planar is desired when the expansion planar and the main planar are oriented for use. As such, the expansion planar coupling system of the present disclosure provides many benefits over conventional expansion planar systems previously known in the art.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An expansion planar system, comprising:
   an expansion planar chassis;
   an expansion planar that is mounted to the expansion planar chassis;
   at least one expansion component that is located on the expansion planar;
   a system connector that is located on the expansion planar and that is coupled to the at least one expansion component through the expansion planar; and
   a system chassis coupling subsystem that is mounted to the expansion planar chassis, wherein the system chassis coupling subsystem is configured to:
      couple to a system chassis that includes a main planar and an expansion connector;
      provide, while coupled to the system chassis, the expansion planar chassis in a first orientation in which the system connector engages the expansion connector and the expansion planar chassis impedes access to a plurality of components on the main planar; and
      provide, while coupled to the system chassis, for rotation of the expansion planar chassis relative to the main planar such that the system connector disengages the expansion connector and the expansion planar chassis enters a second orientation in which access to the plurality of components on the main planar is no longer impeded by the expansion planar chassis.

2. The system of claim 1, wherein the system chassis coupling subsystem includes:
   a biasing subsystem that is configured to provide a force on the expansion planar chassis that is opposite a rotation of the expansion planar chassis from the second orientation to the first orientation.

3. The system of claim 1, wherein expansion planar chassis include at least one airflow directing member that is configure to be positioned adjacent at least one of the plurality of components on the main planar when the expansion planar chassis is in the first orientation.

4. The system of claim 1, wherein the system chassis coupling subsystem is configured to:
   provide for rotation of the expansion planar chassis from the second orientation to the first orientation such that the system connector blind mates with the expansion connector.

5. The system of claim 1, wherein the main planar and the expansion planar provide a keying subsystem that is configured to engage to align the system connector and the expansion connector as the expansion planar chassis moves from the second orientation to the first orientation.

6. The system of claim 1, wherein the system chassis coupling subsystem includes a guide member that is configured to engage a guide feature on the system chassis in order to align the expansion planar and the main planar.

7. The system of claim 1, wherein the plurality of components on the main planar include a main planar processing system and a main planar memory system, and wherein the at least one expansion component on the expansion planar includes an expansion planar processing system and an expansion planar memory system.

8. An Information Handling System (IHS), comprising:
   a system chassis;
   a main planar that is housed in the system chassis and that includes a processing subsystem and a memory subsystem;
   an expansion planar chassis that is coupled to the system chassis by a coupling subsystem;
   an expansion planar that is mounted to the expansion planar chassis;
   at least one expansion component that is located on the expansion planar; and
   a system connector that is located on the expansion planar and that is coupled to the at least one expansion component through the expansion planar;
   wherein the coupling subsystem is configured to:
      provide the expansion planar chassis in a first orientation in which the system connector engages the expansion connector and the expansion planar chassis impedes access to processing subsystem and the memory subsystem on the main planar; and
      provide for rotation of the expansion planar chassis relative to the main planar such that the system connector disengages the expansion connector and the expansion planar chassis enters a second orientation in which access to the processing subsystem and the memory subsystem on the main planar is no longer impeded by the expansion planar chassis.

9. The IHS of claim 8, further comprising:
   a biasing subsystem that is configured to provide a force on the expansion planar chassis that is opposite a rotation of the expansion planar chassis from the second orientation to the first orientation.

10. The IHS of claim 8, wherein expansion planar chassis include at least one airflow directing member that is configure to be positioned adjacent at least one of the plurality of components on the main planar when the expansion planar chassis is in the first orientation.

11. The IHS of claim 8, wherein the coupling system provides for rotation of the expansion planar chassis from the second orientation to the first orientation such that the system connector blind mates with the expansion connector.

12. The IHS of claim 8, wherein the main planar and the expansion planar provide a keying subsystem that is configured to engage to align the system connector and the expansion connector as the expansion planar chassis moves from the second orientation to the first orientation.

13. The IHS of claim 8, wherein the coupling subsystem includes one or more tool-less coupling elements that are configured to couple the expansion planar chassis to and decouple the expansion planar chassis from the system chassis.

14. A method for coupling an expansion planar to a main planar, comprising:
- coupling, by a coupling subsystem mounted to an expansion planar chassis, to a system chassis that houses a main planar and an expansion connector, wherein an expansion planar is mounted to the expansion planar chassis and includes at least one expansion component and a system connector coupled to the at least one expansion component;
- providing, by the coupling subsystem while coupled to the system chassis, the expansion planar chassis in a first orientation such that the system connector engages the expansion connector and the expansion planar chassis impedes access to a plurality of components on the main planar; and
- providing, by the coupling subsystem while coupled to the system chassis, for rotation of the expansion planar chassis relative to the main planar such that the system connector disengages the expansion connector and the expansion planar chassis enters a second orientation in which access to the plurality of components on the main planar is no longer impeded by the expansion planar chassis.

15. The method of claim 14, further comprising:
- providing, by a biasing subsystem coupled to the expansion planar chassis, a force that is opposite a rotation of the expansion planar chassis from the second orientation to the first orientation.

16. The method of claim 14, further comprising:
- directing, by at least one airflow directing member that is included on the expansion planar chassis and positioned adjacent at least one of the plurality of components on the main planar when the expansion planar chassis is in the first orientation, air over the at least one of the plurality of components on the main planar.

17. The method of claim 14, further comprising:
- providing, by the coupling subsystem while coupled to the system chassis, for rotation of the expansion planar chassis from the second orientation to the first orientation such that the system connector blind mates with the expansion connector.

18. The method of claim 14, further comprising:
- engaging a keying subsystem provided on the main planar and the expansion planar to align the system connector and the expansion connector as the expansion planar chassis moves from the second orientation to the first orientation.

19. The method of claim 14, further comprising:
- engaging, by a guide member on the coupling subsystem, a guide feature on the system chassis in order to align the expansion planar and the main planar.

20. The method of claim 14, wherein the plurality of components on the main planar include a main planar processing system and a main planar memory system, and wherein the at least one expansion component on the expansion planar includes an expansion planar processing system and an expansion planar memory system.

* * * * *